United States Patent
Mayuzumi et al.

(10) Patent No.: US 10,748,966 B2
(45) Date of Patent: Aug. 18, 2020

(54) THREE-DIMENSIONAL MEMORY DEVICE CONTAINING COBALT CAPPED COPPER LINES AND METHOD OF MAKING THE SAME

(71) Applicant: SANDISK TECHNOLOGIES LLC, Addison, TX (US)

(72) Inventors: Satoru Mayuzumi, San Jose, CA (US); Wei Kuo Shih, Cupertino, CA (US); Yuji Takahashi, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 89 days.

(21) Appl. No.: 16/021,694

(22) Filed: Jun. 28, 2018

(65) Prior Publication Data

US 2020/0006431 A1    Jan. 2, 2020

(51) Int. Cl.
*H01L 27/24* (2006.01)
*H01L 23/528* (2006.01)
*H01L 23/532* (2006.01)
*H01L 45/00* (2006.01)
*H01L 43/02* (2006.01)
*H01L 43/12* (2006.01)
*H01L 27/22* (2006.01)

(52) U.S. Cl.
CPC ........ *H01L 27/2481* (2013.01); *H01L 23/528* (2013.01); *H01L 23/53238* (2013.01); *H01L 27/224* (2013.01); *H01L 27/2427* (2013.01); *H01L 43/02* (2013.01); *H01L 43/12* (2013.01); *H01L 45/06* (2013.01); *H01L 45/08* (2013.01); *H01L 45/1233* (2013.01); *H01L 45/1253* (2013.01); *H01L 45/16* (2013.01); *H01L 23/53247* (2013.01); *H01L 23/53261* (2013.01)

(58) Field of Classification Search
CPC ............... H01L 27/2481; H01L 23/528; H01L 23/53238
See application file for complete search history.

(56) References Cited

U.S. PATENT DOCUMENTS 8,097,498 B2    1/2012   Purayath et al.
8,349,681 B2    1/2013   Alsmeier et al.
(Continued)

OTHER PUBLICATIONS

Ryu, S.W. et al., "Area-selective chemical vapor deposition of Co for Cu capping layer," Current Applied Physics No. 16, pp. 88-92 (2016).

(Continued)

*Primary Examiner* — Lex H Malsawma
*Assistant Examiner* — Xia L Cross
(74) *Attorney, Agent, or Firm* — The Marbury Law Group, PLLC

(57) ABSTRACT

A memory device includes first conductive rails laterally extending along a first horizontal direction over a substrate, where the first conductive rails include a fill portion, and a first cobalt-containing cap liner contacting a top surface of the fill portion, a rectangular array of first memory pillar structures overlying top surfaces of the first conductive rails, where each first memory pillar structure includes a respective first resistive memory element, and second conductive rails laterally extending along a second horizontal direction and overlying top surfaces of the rectangular array of first memory pillar structures.

1 Claim, 18 Drawing Sheets

(56) References Cited

U.S. PATENT DOCUMENTS

| | | |
|---|---|---|
| 8,575,000 B2 | 11/2013 | Purayath et al. |
| 9,159,739 B2 | 10/2015 | Makala et al. |
| 9,576,966 B1 | 2/2017 | Peri et al. |
| 9,646,975 B2 | 5/2017 | Peri et al. |
| 9,842,907 B2 | 12/2017 | Makala et al. |
| 9,984,963 B2 | 5/2018 | Peri et al. |
| 2008/0211097 A1* | 9/2008 | Kawahara ......... H01L 21/76849 257/751 |
| 2013/0064001 A1* | 3/2013 | Terai ................. H01L 45/04 365/148 |
| 2013/0181183 A1* | 7/2013 | Pellizzer ............. H01L 45/06 257/5 |
| 2014/0225057 A1* | 8/2014 | Matamis ............ H01L 45/1233 257/5 |
| 2015/0179662 A1 | 6/2015 | Makala et al. |
| 2017/0287925 A9 | 10/2017 | Makala et al. |
| 2017/0352669 A1 | 12/2017 | Sharangpani et al. |
| 2018/0033646 A1 | 2/2018 | Sharangpani et al. |
| 2018/0123038 A1* | 5/2018 | Lee ................... H01L 27/10826 |
| 2018/0138194 A1 | 5/2018 | Shigemura et al. |
| 2019/0148636 A1* | 5/2019 | Kim .................... H01L 45/146 257/3 |

OTHER PUBLICATIONS

Edelstein, D. C., "20 Years of Cu BEOL in Manufacturing, and its Future Prospects," Tech. Dig. IEDM, pp. 14.1.1 (2017).

U.S. Appl. No. 15/720,556, filed Sep. 29, 2017, SanDisk Technologies LLC.

U.S. Appl. No. 15/888,645, filed Feb. 5, 2018, SanDisk Technologies LLC.

U.S. Appl. No. 15/898,571, filed Feb. 17, 2018, SanDisk Technologies LLC.

U.S. Appl. No. 15/924,944, filed Mar. 19, 2018, SanDisk Technologies LLC.

* cited by examiner

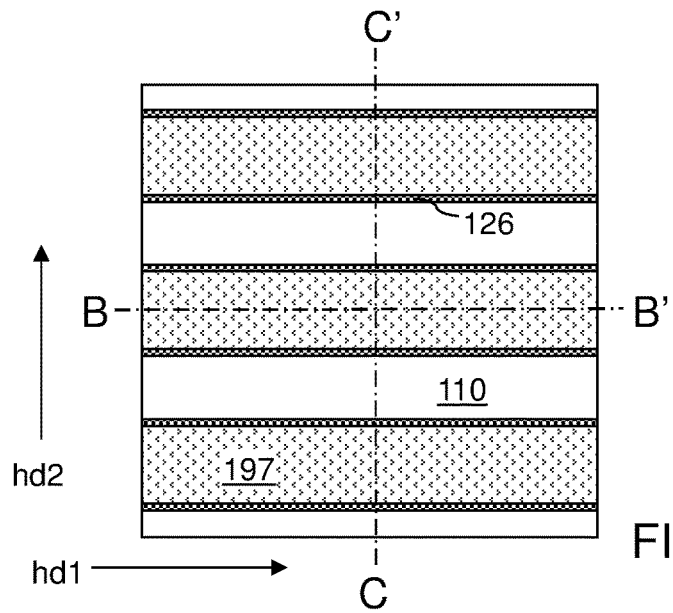
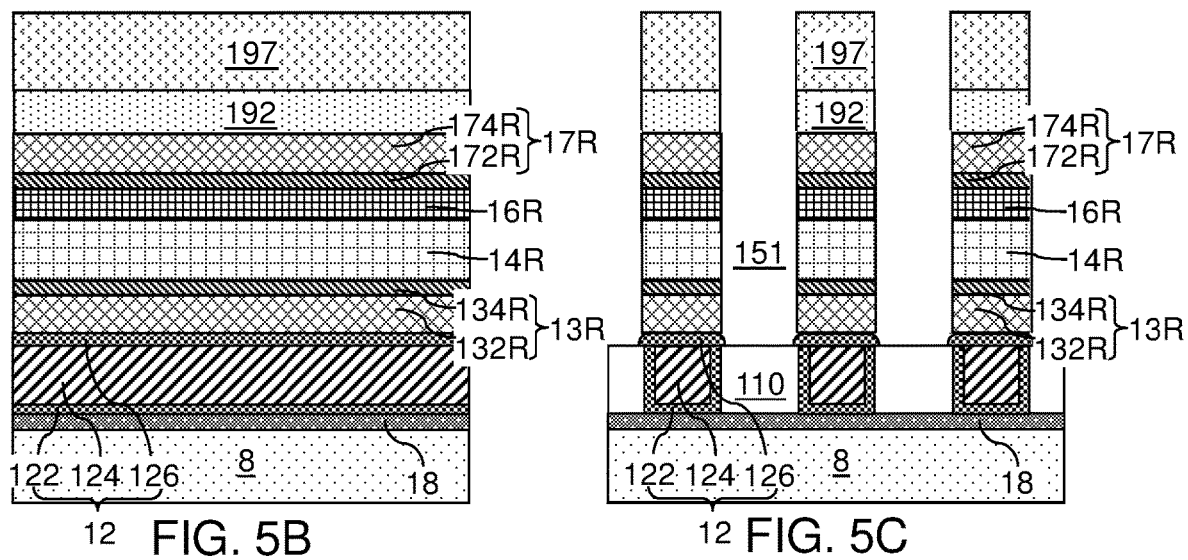

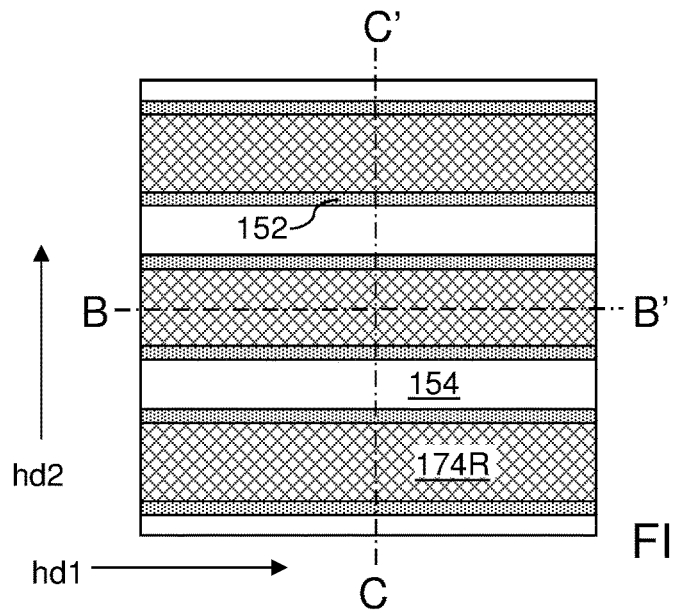
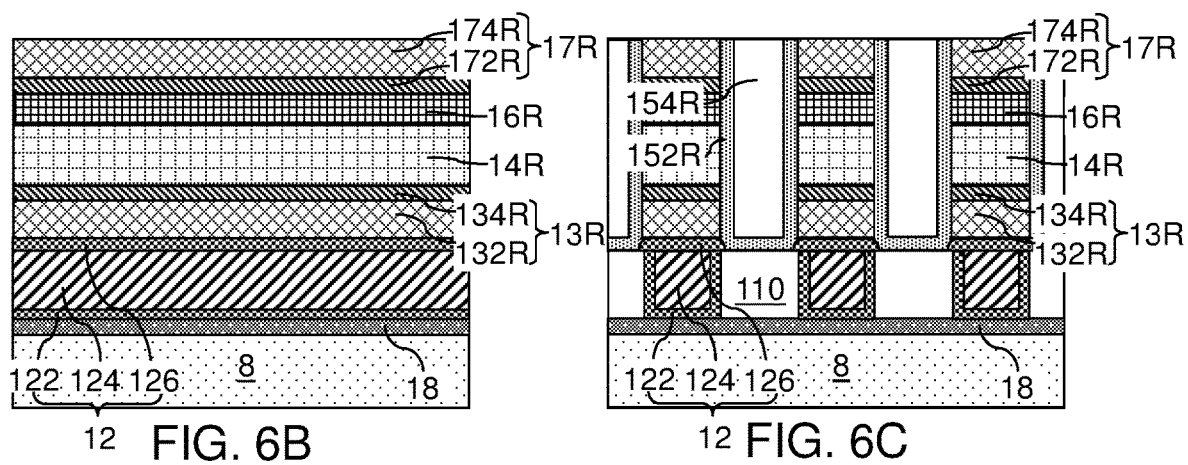
FIG. 6A
FIG. 6B
FIG. 6C

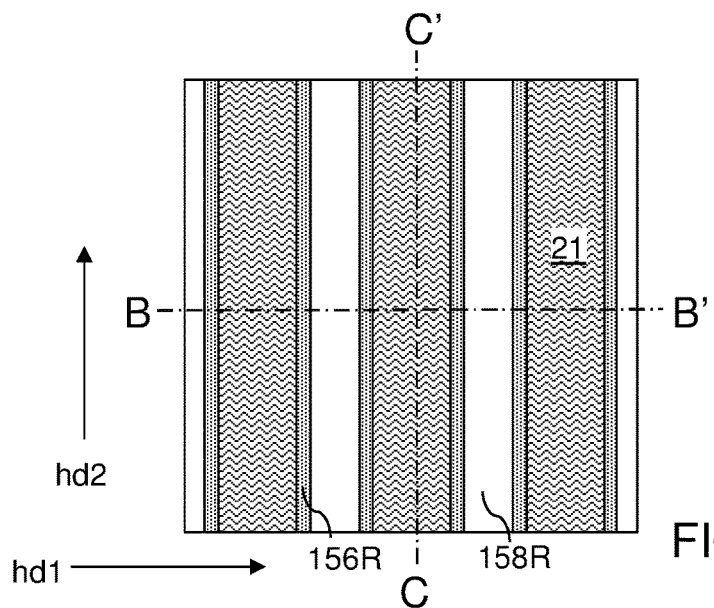
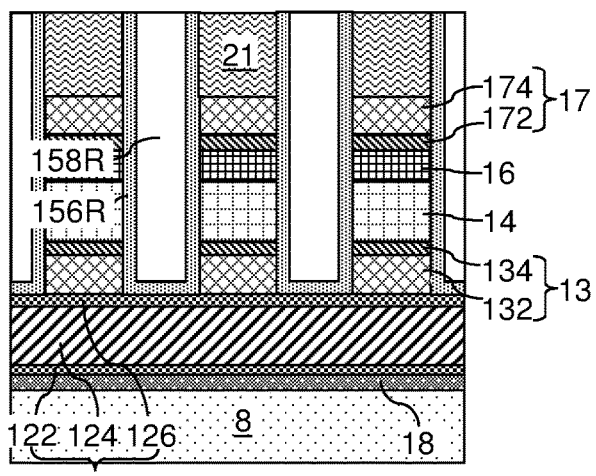
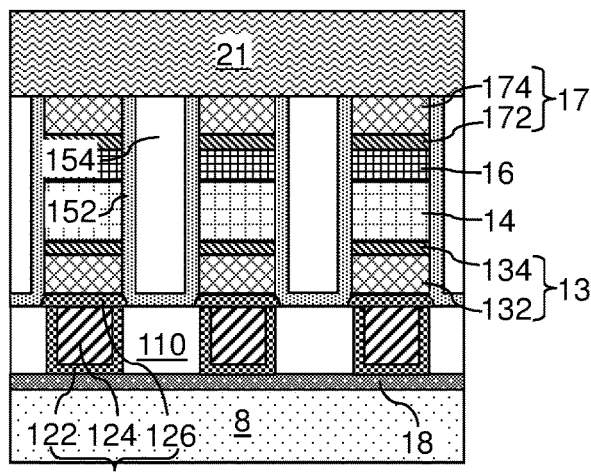

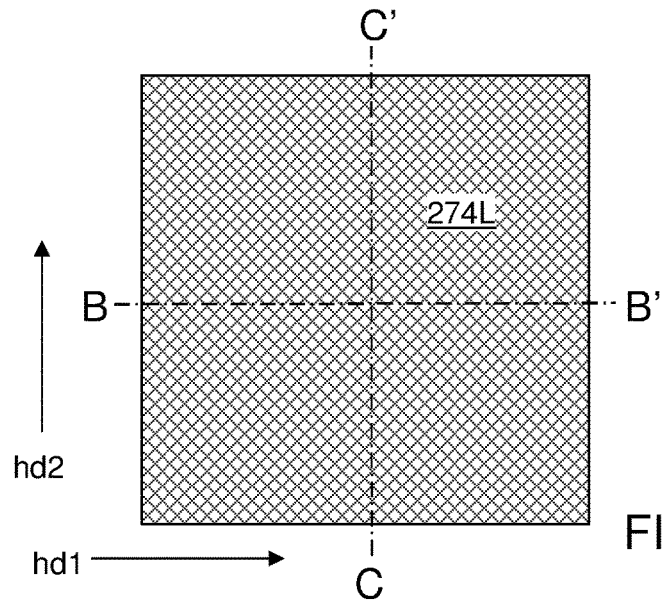
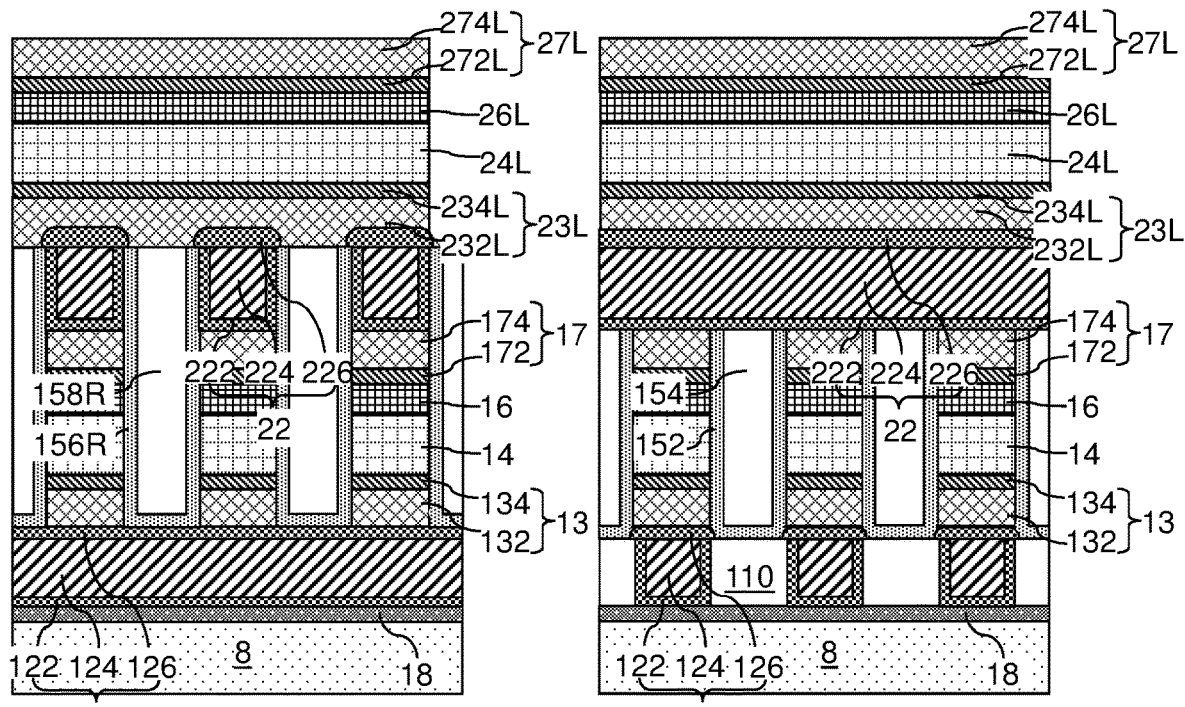

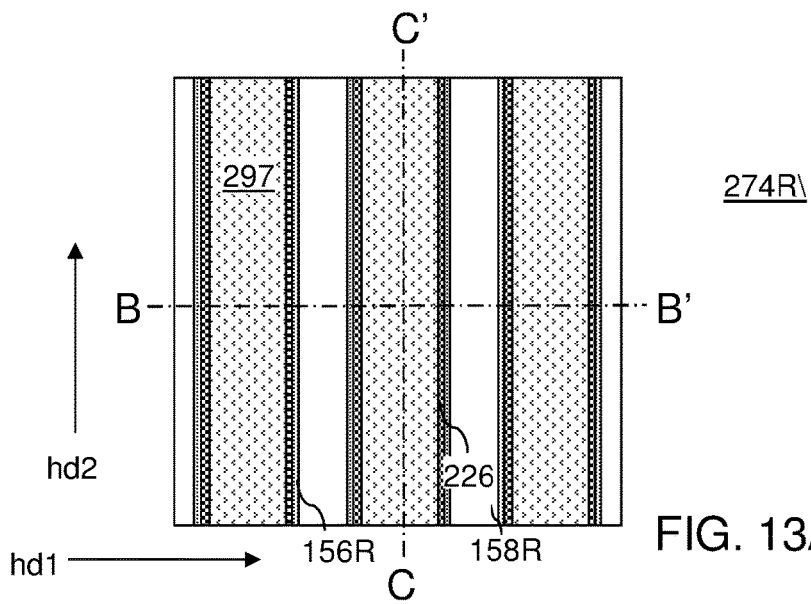
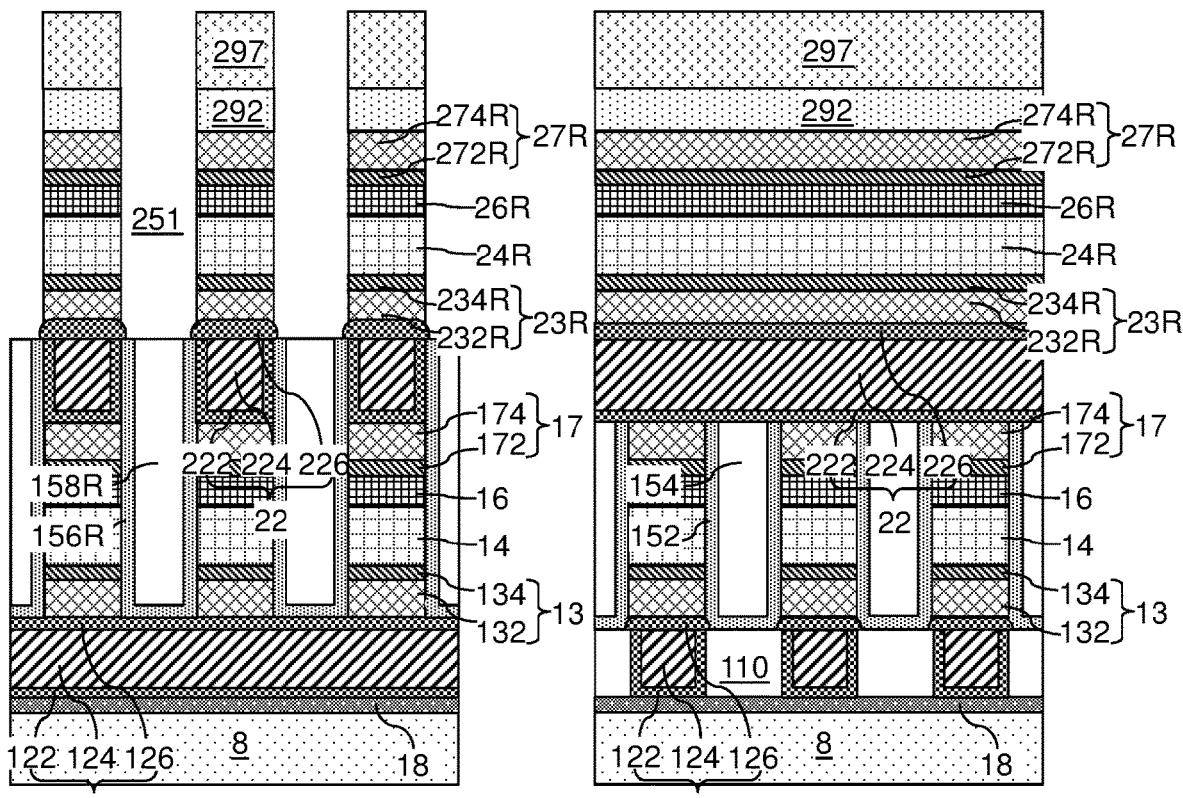
FIG. 13A
FIG. 13B
FIG. 13C

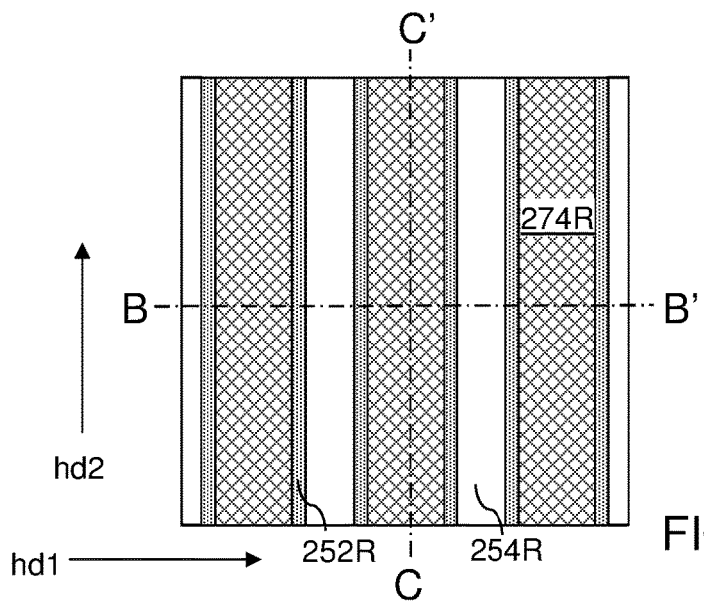
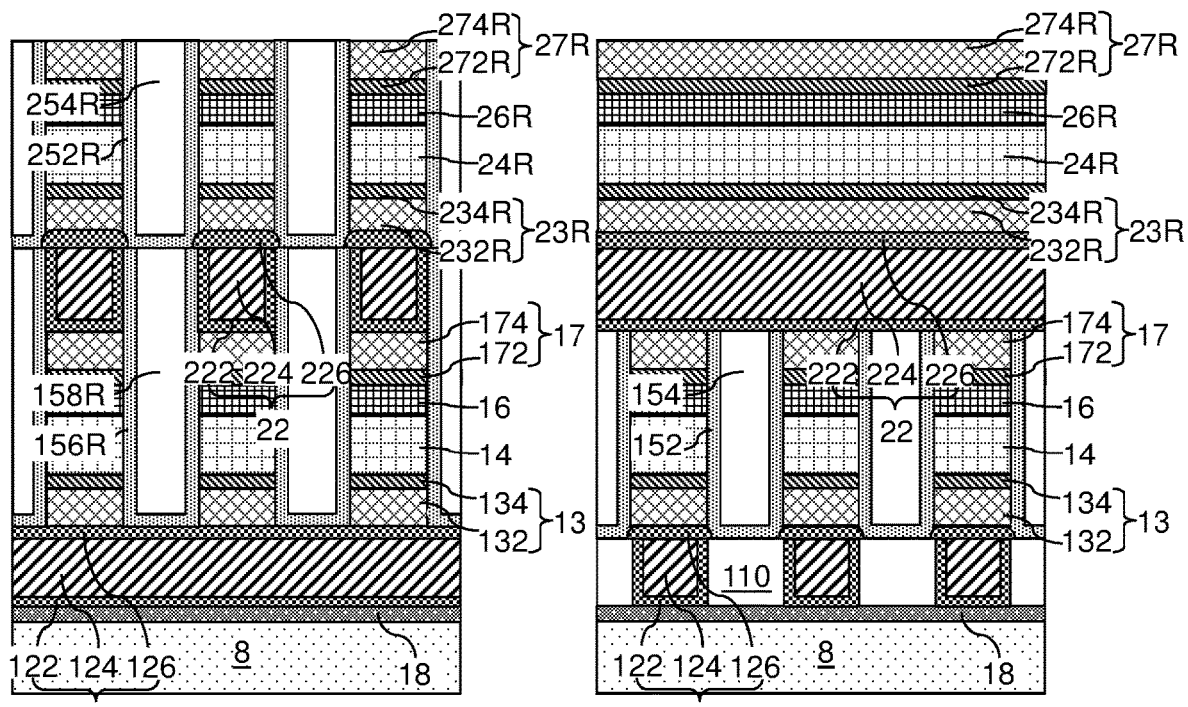
FIG. 14A
FIG. 14B
FIG. 14C

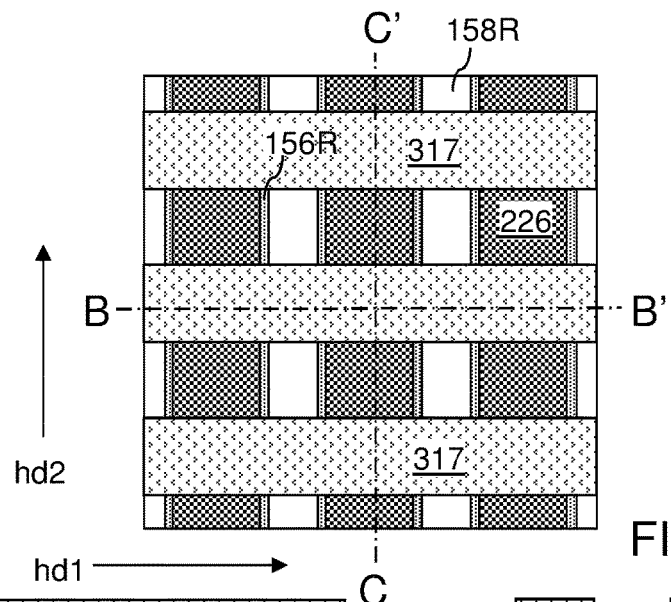
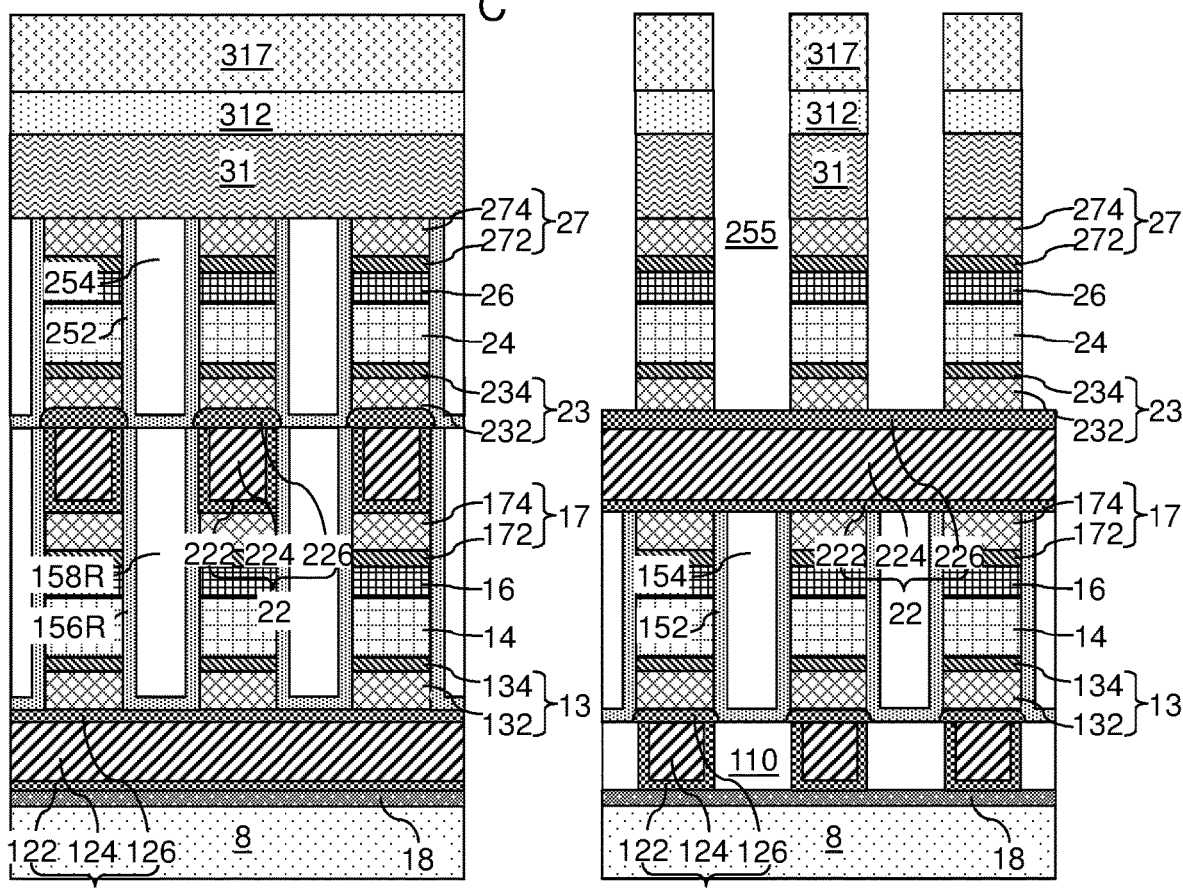
FIG. 15A
FIG. 15B
FIG. 15C

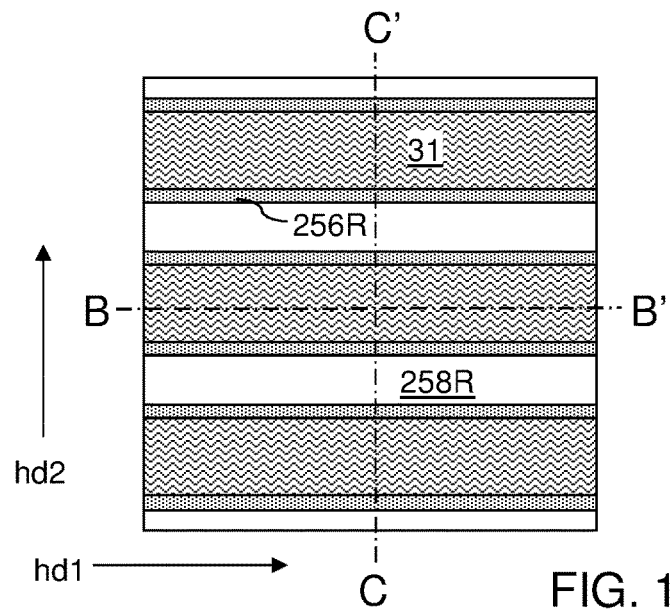
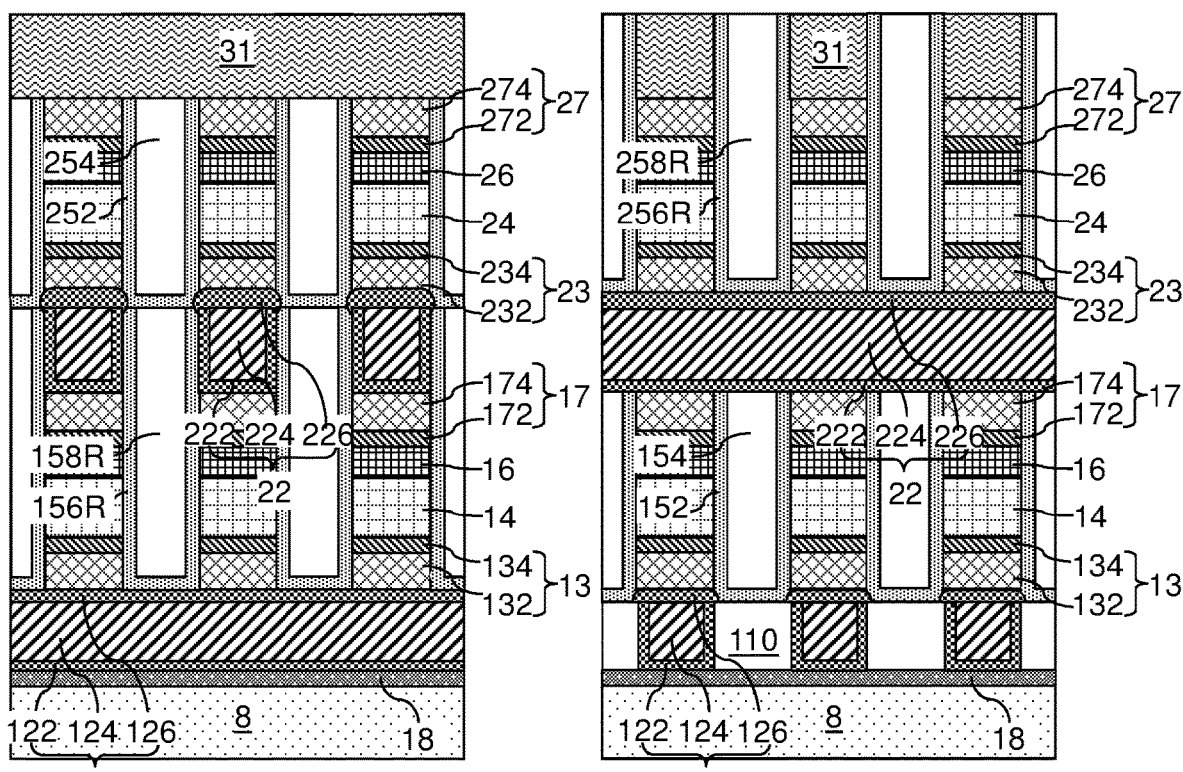

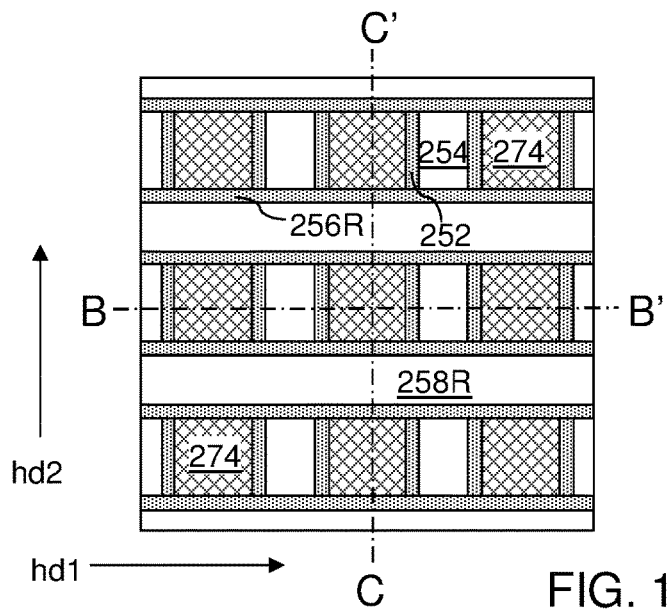
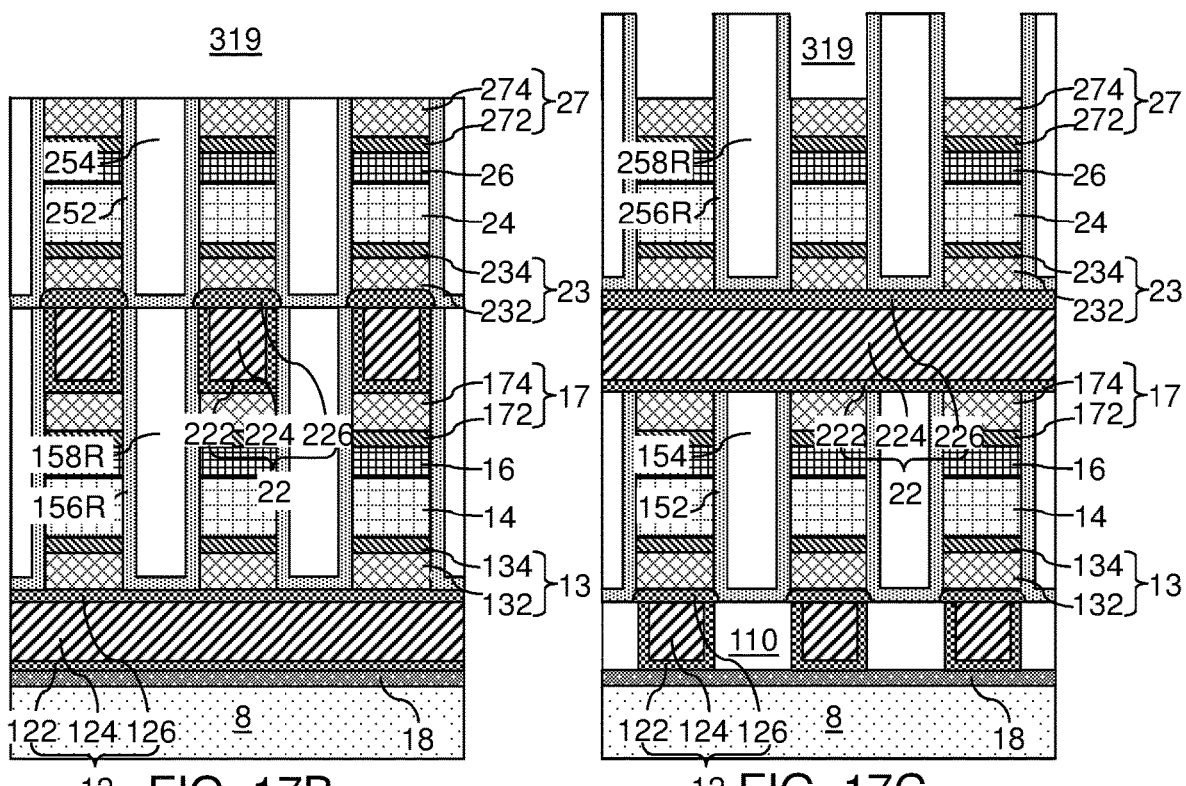
FIG. 17A
FIG. 17B
FIG. 17C

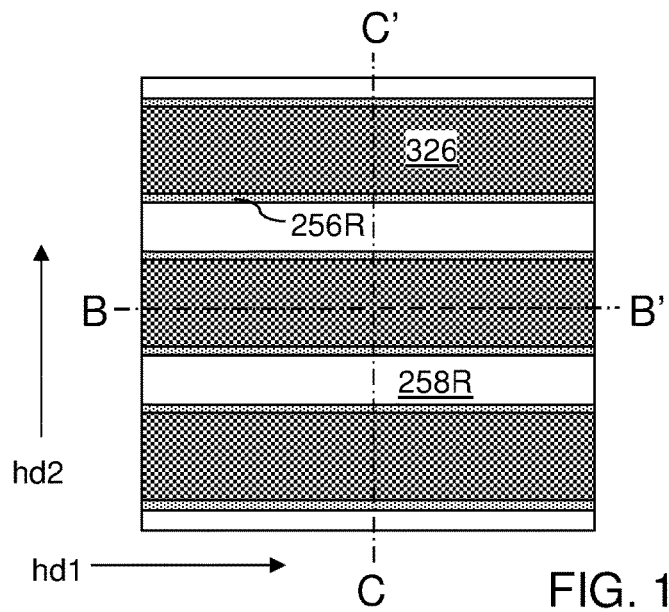
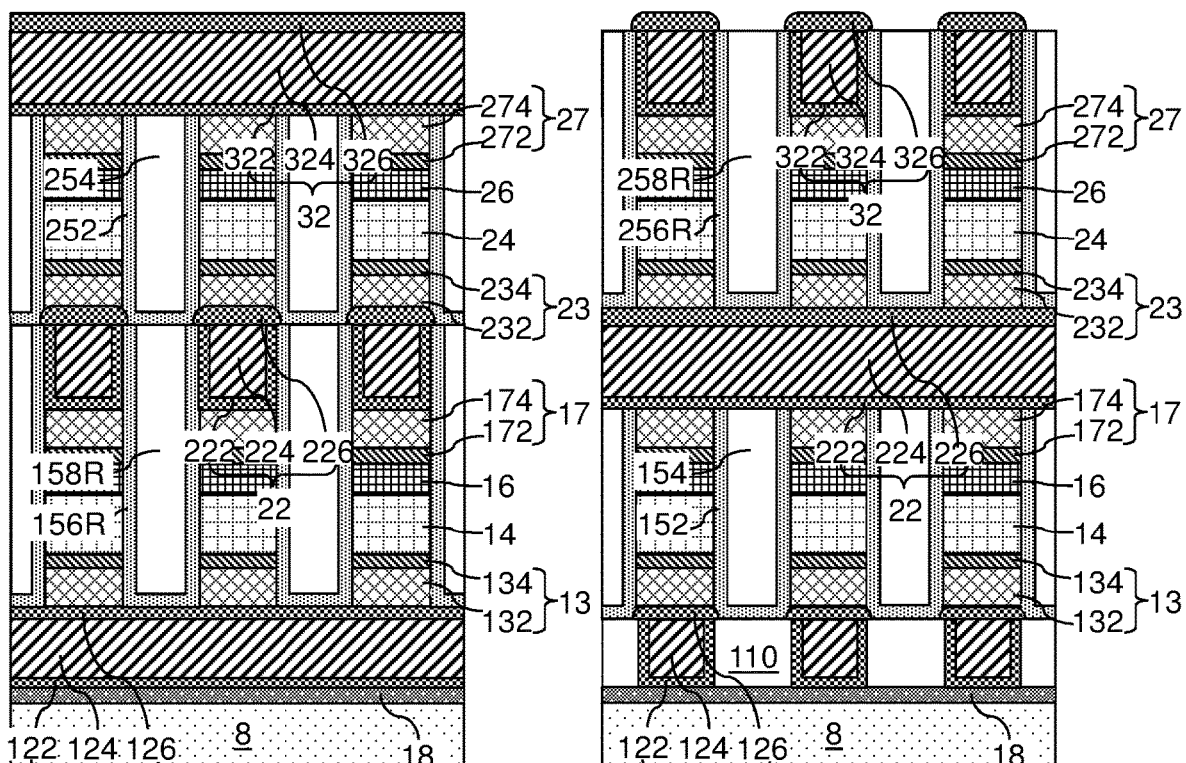
FIG. 18A, FIG. 18B, FIG. 18C

US 10,748,966 B2

THREE-DIMENSIONAL MEMORY DEVICE CONTAINING COBALT CAPPED COPPER LINES AND METHOD OF MAKING THE SAME

FIELD

The present disclosure relates generally to the field of semiconductor devices and specifically to a three-dimensional memory device containing cobalt capped copper lines and methods of forming the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material amorphous in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a memory device includes first conductive rails laterally extending along a first horizontal direction over a substrate, where the first conductive rails include a first liner contacting sidewalls and a bottom surface of a first copper-containing fill portion, and a first cobalt-containing cap liner contacting a top surface of the first copper-containing fill portion, a rectangular array of first memory pillar structures overlying top surfaces of the first conductive rails, where each first memory pillar structure includes a respective first resistive memory element, and second conductive rails laterally extending along a second horizontal direction and overlying top surfaces of the rectangular array of first memory pillar structures.

According to another aspect of the present disclosure, a method of forming a memory device comprises forming a laterally alternating sequence of in-process first conductive rails and first dielectric rails, wherein each of the in-process first conductive rails and the first dielectric rails laterally extend along a first horizontal direction, and wherein each of the in-process first conductive rails comprises a first liner contacting sidewalls and a bottom surface of a first copper-containing fill portion, selectively growing a first cobalt-containing cap liner from physically exposed surfaces of the first copper-containing fill portion while suppressing growth of cobalt from physically exposed surfaces of the first dielectric rails, wherein each contiguous combination of an in-process first conductive rail and a first cobalt-containing cap liner constitutes a first conductive rail, forming a rectangular array of first memory pillar structures over top surfaces of the first conductive rails, wherein each first memory pillar structure comprises a respective first resistive memory element, and forming second conductive rails laterally extending along a second horizontal direction and overlying top surfaces of the rectangular array of first memory pillar structures.

According to another embodiment of the present disclosure, a method of forming a memory device comprises forming a laterally alternating sequence of in-process first conductive rails and first dielectric rails, wherein each of the in-process first conductive rails and the first dielectric rails laterally extend along a first horizontal direction, and wherein each of the in-process first conductive rails comprises a first fill portion selected from cobalt, ruthenium, molybdenum, a cobalt alloy, a ruthenium alloy, a molybdenum alloy, copper or a copper based metallic material, selectively growing a first cobalt-containing cap liner from physically exposed surfaces of the first fill portion while suppressing growth of cobalt from physically exposed surfaces of the first dielectric rails, wherein each contiguous combination of an in-process first conductive rail and a first cobalt-containing cap liner constitutes a first conductive rail, forming a rectangular array of first memory pillar structures over top surfaces of the first conductive rails, wherein each first memory pillar structure comprises a respective first resistive memory element, and forming second conductive rails laterally extending along a second horizontal direction and overlying top surfaces of the rectangular array of first memory pillar structures.

According to another embodiment of the present disclosure, a memory device comprises first conductive rails laterally extending along a first horizontal direction over a substrate, wherein each of the first conductive rails comprises a fill portion selected from cobalt, ruthenium, molybdenum, a cobalt alloy, a ruthenium alloy, a molybdenum alloy, copper or a copper based metallic material, and a first cobalt-containing cap liner contacting a top surface of the fill portion, a rectangular array of first memory pillar structures overlying top surfaces of the first conductive rails, wherein each first memory pillar structure comprises a respective first resistive memory element, and second conductive rails laterally extending along a second horizontal direction and overlying top surfaces of the rectangular array of first memory pillar structures.

BRIEF DESCRIPTION OF THE DRAWINGS

FIG. 5A is a top-down view of the exemplary structure after formation of first memory-level isolation trenches according to an embodiment of the present disclosure.

FIG. 5B is a vertical cross-sectional view of the exemplary structure along the vertical plane B-B' of FIG. 5A.

FIG. 5C is a vertical cross-sectional view of the exemplary structure along the vertical plane C-C' of FIG. 5A.

FIG. 6A is a top-down view of the exemplary structure after formation of in-process first-level dielectric isolation structures according to an embodiment of the present disclosure.

FIG. 6B is a vertical cross-sectional view of the exemplary structure along the vertical plane B-B' of FIG. 6A.

FIG. 6C is a vertical cross-sectional view of the exemplary structure along the vertical plane C-C' of FIG. 6A.

FIG. 8A is a top-down view of the exemplary structure after formation of first dielectric isolation rails according to an embodiment of the present disclosure.

FIG. 8B is a vertical cross-sectional view of the exemplary structure along the vertical plane B-B' of FIG. 8A.

FIG. 8C is a vertical cross-sectional view of the exemplary structure along the vertical plane C-C' of FIG. 8A.

FIG. 12A is a top-down view of the exemplary structure after formation of a second layer stack including second bottom electrode layers, a second resistive memory material layer, a second selector layer, and second top electrode layers according to an embodiment of the present disclosure.

FIG. 12B is a vertical cross-sectional view of the exemplary structure along the vertical plane B-B' of FIG. 12A.

FIG. 12C is a vertical cross-sectional view of the exemplary structure along the vertical plane C-C' of FIG. 12A.

FIG. 13A is a top-down view of the exemplary structure after formation of second memory-level isolation trenches according to an embodiment of the present disclosure.

FIG. 13B is a vertical cross-sectional view of the exemplary structure along the vertical plane B-B' of FIG. 13A.

FIG. 13C is a vertical cross-sectional view of the exemplary structure along the vertical plane C-C' of FIG. 13A.

FIG. 14A is a top-down view of the exemplary structure after formation of second dielectric isolation structures according to an embodiment of the present disclosure.

FIG. 14B is a vertical cross-sectional view of the exemplary structure along the vertical plane B-B' of FIG. 14A.

FIG. 14C is a vertical cross-sectional view of the exemplary structure along the vertical plane C-C' of FIG. 14A.

FIG. 15A is a top-down view of the exemplary structure after formation of a second sacrificial material layer and forming second divider trenches through the second sacrificial material layer and the second dielectric isolation structures according to an embodiment of the present disclosure.

FIG. 15B is a vertical cross-sectional view of the exemplary structure along the vertical plane B-B' of FIG. 15A.

FIG. 15C is a vertical cross-sectional view of the exemplary structure along the vertical plane C-C' of FIG. 15A.

FIG. 16A is a top-down view of the exemplary structure after formation of second dielectric isolation structures according to an embodiment of the present disclosure.

FIG. 16B is a vertical cross-sectional view of the exemplary structure along the vertical plane B-B' of FIG. 16A.

FIG. 16C is a vertical cross-sectional view of the exemplary structure along the vertical plane C-C' of FIG. 16A.

FIG. 17A is a top-down view of the exemplary structure after formation of second line cavities by removal of second sacrificial material rails according to an embodiment of the present disclosure.

FIG. 17B is a vertical cross-sectional view of the exemplary structure along the vertical plane B-B' of FIG. 17A.

FIG. 17C is a vertical cross-sectional view of the exemplary structure along the vertical plane C-C' of FIG. 17A.

FIG. 18A is a top-down view of the exemplary structure after formation of third conductive rails according to an embodiment of the present disclosure.

FIG. 18B is a vertical cross-sectional view of the exemplary structure along the vertical plane B-B' of FIG. 18A.

FIG. 18C is a vertical cross-sectional view of the exemplary structure along the vertical plane C-C' of FIG. 18A.

DETAILED DESCRIPTION

Figure 1A:
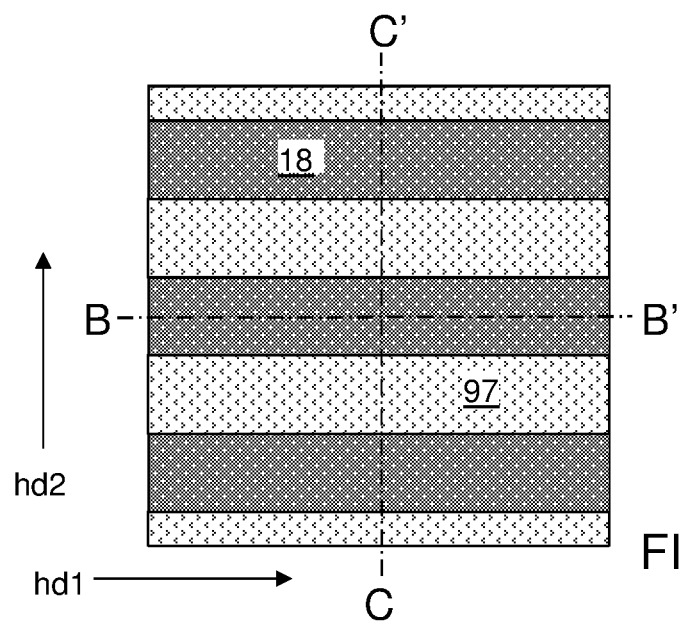
FIG. 1A is a top-down view of an exemplary structure for forming a three-dimensional phase change memory device after formation of a dielectric etch stop layer, a first dielectric matrix layer, and a first hard mask layer, and patterning of the first hard mask layer and the first dielectric matrix layer according to an embodiment of the present disclosure.

Generally, sheet resistances and parasitic capacitances of access lines, such as word lines (WL) and bit lines (BL) containing tungsten are relatively high for cross-point memory array of resistive memory elements, such as PCM memory elements. Higher performance driver transistors are provided to counteract the performance degradation caused by the IR drop and the RC delay in such word lines and bit lines, and to maintain satisfactory overall device performance level.

Thicker lines can provide a reduced resistance, but lead to degradation of the parasitic capacitance between the lines because the parasitic capacitance is dominated in the capacitive coupling between the lines. Pitch scaling additionally increases the parasitic capacitances.

In view of the above, embodiments of the present disclosure provide high performance cobalt capped copper access lines with reduced resistance and without significant increase in the processing cost. Embodiments of the present disclosure are directed to a three-dimensional memory array employing self-aligned cobalt access line caps and methods of forming the same, the various aspects of which are described below. The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
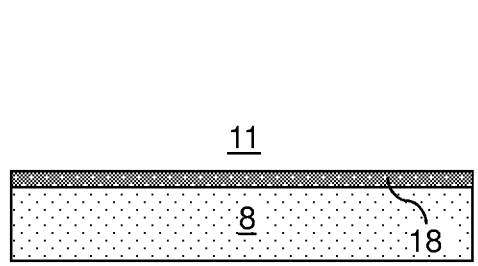
FIG. 1B is a vertical cross-sectional view of the exemplary structure along the vertical plane B-B' of FIG. 1A.
Figure 1C:
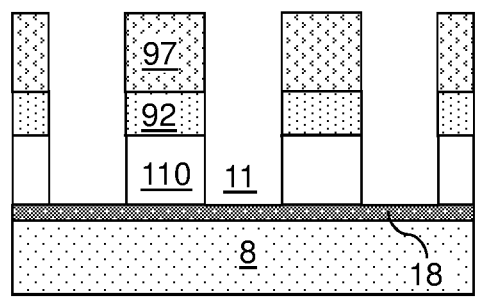
FIG. 1C is a vertical cross-sectional view of the exemplary structure along the vertical plane C-C' of FIG. 1A.

Referring to FIGS. 1A-1C, an exemplary structure for forming a three-dimensional phase change memory device is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

A dielectric etch stop layer 18, a first dielectric matrix layer, and a first hard mask layer are sequentially formed over the substrate 8. The dielectric etch stop layer 18 includes a dielectric material that can be employed as an etch stop material portion during a subsequent anisotropic etch process that patterns the first dielectric matrix layer into first dielectric rails 110. For example, the dielectric etch stop layer 18 can include silicon nitride or a dielectric metal oxide (such as aluminum oxide). The thickness of the dielectric etch stop layer 18 can be in a range from 4 nm to 40 nm, although lesser and greater thicknesses can also be employed.

The first dielectric matrix layer includes a dielectric material that can be subsequently employed as a matrix material for embedding first conductive rails. For example, the first dielectric matrix layer can include undoped silicate glass, a doped silicate glass, porous or non-porous organosilicate glass, or metal oxide (such as aluminum oxide). The thickness of the first dielectric matrix layer can be in a range from 10 nm to 100 nm, such as from 20 nm to 50 nm, although lesser and greater thicknesses can also be employed.

The first hard mask layer includes a hard mask material such as silicon nitride, amorphous silicon or amorphous carbon. The thickness of the first hard mask layer can be in a range from 10 nm to 60 nm, although lesser and greater thicknesses can also be employed. Alternatively, the first hard mask layer can include two or more materials, for example silicon nitride, silicon oxide, amorphous silicon or amorphous carbon, to apply a double patterning process.

A first photoresist layer 97 can be applied over the first hard mask layer, and can be lithographically patterned with a line and space pattern. Elongated openings laterally extending along a first horizontal direction hd1 and laterally spaced apart among one another along a second horizontal direction hd2 can be formed in the first photoresist layer 97. The openings in the photoresist layer 97 can have the same width along the second horizontal direction hd2 that is invariant with translation along the first horizontal direction hd1. The width of each opening along the second horizontal direction hd2 can be in a range from 10 nm to 50 nm, such as 15 nm to 25 nm, although lesser and greater widths can also be employed. The width of the first dielectric rails 110 along the second horizontal direction hd2 can be 10 nm to 50 nm, such as 15 nm to 25 nm.

The pattern in the first photoresist layer 97 can be transferred through the first hard mask layer and the first dielectric matrix layer by an anisotropic etch process. First line trenches 11 are formed through first hard mask layer and the first dielectric matrix layer. The remaining portions of the first hard mask layer constitutes first hard mask strips 92 that laterally extend along the first direction. As used herein, a "strip" refers to a rail in which the thickness is less than the width. The remaining portions of the first dielectric matrix layer constitute first dielectric rails 110. The sidewalls of the first dielectric rails 110 can be tapered by a taper angle between 5 and 20 degrees from vertical such that the width of each first line trench 11 is greater at the top than at the bottom. The dielectric etch stop layer 18 can be employed as an etch stop structure during the anisotropic etch process. The first line trenches 11 can include lengthwise sidewalls that laterally extend along the first horizontal direction hd1. In one embodiment a vertical cross-sectional shape of each first line trench 11 within vertical planes perpendicular to the first horizontal direction hd1 can be invariant with translation along the first horizontal direction hd1. The first photoresist layer 97 can be subsequently removed, for example, by ashing.

Figure 2A:
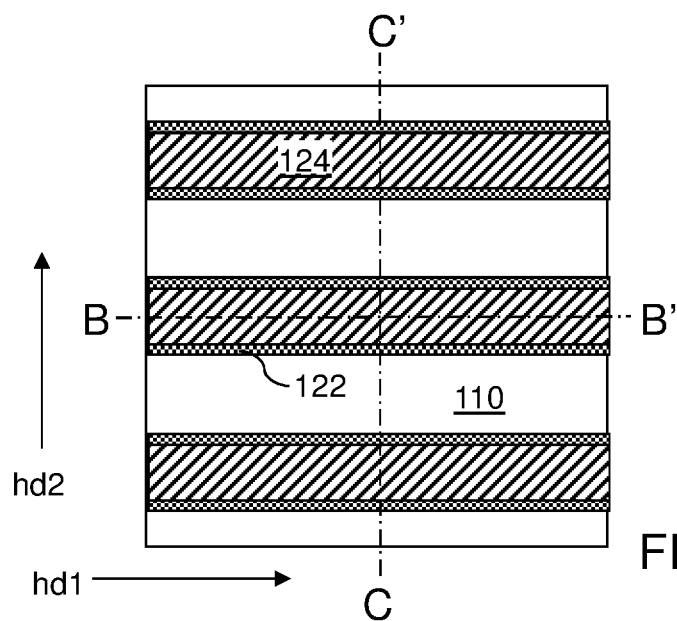
FIG. 2A is a top-down view of the exemplary structure after formation of in-process first conductive rails including a respective first metallic liner and a respective first metal fill portion according to an embodiment of the present disclosure.
Figure 2B:
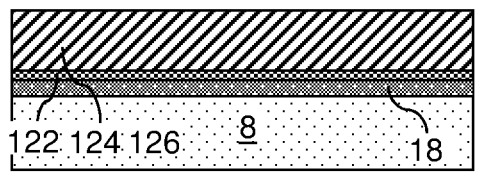
FIG. 2B is a vertical cross-sectional view of the exemplary structure along the vertical plane B-B' of FIG. 2A.
Figure 2C:
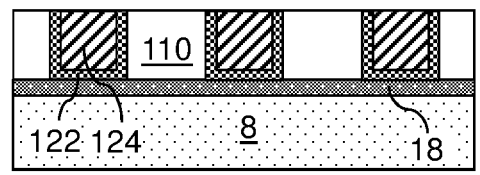
FIG. 2C is a vertical cross-sectional view of the exemplary structure along the vertical plane C-C' of FIG. 2A.

Referring to FIGS. 2A-2C, in-process first conductive rails (122, 124) are formed within each first line trench 11 by deposition and planarization of at least one first metallic material. As used herein, an "in-process" element is an element that is formed during a manufacturing process that is subsequently modified, or is combined with another element, to provide another structure in a final device structure. For example, a first metallic liner material and a first metal fill material can be sequentially formed in the first line trenches 11. The first metallic liner material can include cobalt, ruthenium or molybdenum. In one embodiment, the first metallic liner material can consist essentially of cobalt or can comprise a cobalt alloy such as a cobalt-tungsten phosphorus (CoWP) alloy, a cobalt-tungsten-nitrogen (CoWN) alloy, or a cobtalt-tungsten-boron-phosphorus (CoWBP) alloy. In another embodiment, the first metallic liner material can consist of ruthenium, a ruthenium alloy such as RuTiN, RuSi, RuTa, RuN, or molybdenum or a molybdenum alloy such as MoN, MoSi, MoSiN. The first metallic liner material can be deposited non-selectively by a conformal deposition or a non-conformal deposition. For example, the first metallic liner material can be deposited by physical vapor deposition (PVD), chemical vapor deposition (CVD) or atomic layer deposition (ALD). The thickness of the first metallic liner material can be in a range from 1 nm to 10 nm, such as from 2 nm to 7 nm, although lesser and greater thicknesses can also be employed. The first metal fill material can include copper or a copper-based metallic fill material including copper at an atomic concentration greater than 90%, which may be greater than 95% and/or 99%. The first metal fill material can consist essentially copper of a copper-based metallic fill material, such as a copper-silicon alloy containing 1 to 2 atomic percent silicon. In one embodiment, the first metal fill material can include copper that is deposited by electroplating. In another embodiment, the first metallic liner and the first metal fill material consist of the same material, for example cobalt, ruthenium, molybdenum, a cobalt alloy, a ruthenium alloy, a molybdenum alloy, copper or a copper based (e.g., copper alloy having greater than 50 atomic percent copper) metallic material. Thus, the first metallic liner and the first metal fill material may comprise one metal or metal alloy that is deposited during the same deposition step.

The first metal fill material and the first metallic liner material can be subsequently planarized by a planarization process, which can employ chemical mechanical planarization (CMP) and/or a recess etch. Top surfaces of the remaining portions of the first metal fill material and the first metallic liner material can be formed at, or near, the level of the top surface of the first dielectric rails 110. In one embodiment, the top surfaces of the remaining portions of the first metal fill material and the first metallic liner material can be vertically recessed below the top surfaces of the first hard mask strips 92 by a recess etch process and the first hard mask strips 92 can be removed selective to the first dielectric rails 110 by an isotropic etch process. For example, if the first hard mask strips 92 include silicon nitride and if the first dielectric rails 110 includes silicon oxide, a wet etch employing hot phosphoric acid can be performed. Alternatively, the first hard mask strips 92 can be thin enough to be consumed during the planarization process. For example, the planarization process can employ chemical mechanical planarization and the first hard mask strips 92 can be removed at a terminal portion of the chemical mechanical planarization process.

Each remaining portion of the first metallic liner material constitutes a first metallic liner 122. Each remaining portion of the first metal fill material constitutes a first metal fill material portion 124. Each pair of a first metallic liner 122 and a first metal fill material portion 124 filling a first line trench 11 constitutes an in-process first conductive rail (122, 124). The in-process first conductive rails (122, 124) laterally extend along the first horizontal direction hd1 and are laterally spaced apart along the second horizontal direction hd2 by the first dielectric rails 110. A laterally alternating sequence of in-process first conductive rails (122, 124) and first dielectric rails 110 is formed. Each of the in-process first conductive rails (122, 124) and the first dielectric rails 110 laterally extend along the first horizontal direction hd1. Each of the in-process first conductive rails (122, 124) comprises a first metallic liner 122 surrounding on three sides and contacting sidewalls and a bottom surface of, a first metal fill portion 124. In one embodiment, the first metal fill portions 124 comprise copper atoms at an atomic concentration greater than 90%. In one embodiment, the top surfaces of the in-process first conductive rails (122, 124) and the first dielectric rails 110 may be formed within a same horizontal plane.

Figure 3A:
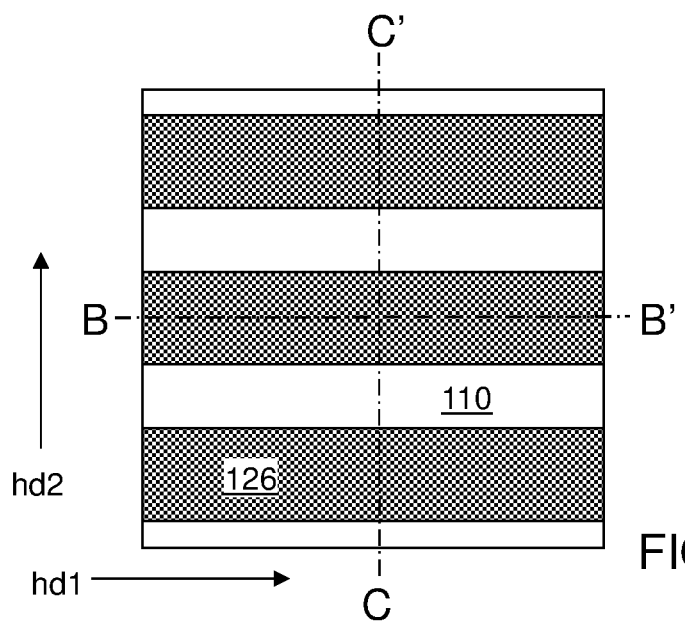
FIG. 3A is a top-down view of the exemplary structure after selective growth of first cobalt cap liners according to an embodiment of the present disclosure.
Figure 3B:
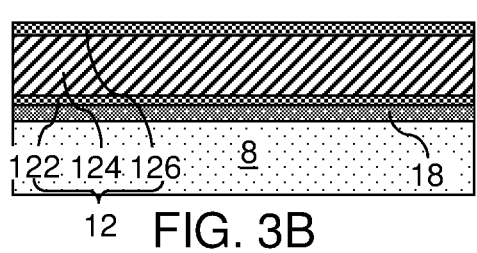
FIG. 3B is a vertical cross-sectional view of the exemplary structure along the vertical plane B-B' of FIG. 3A.
Figure 3C:
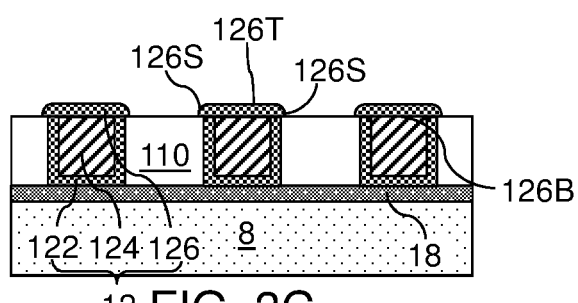
FIG. 3C is a vertical cross-sectional view of the exemplary structure along the vertical plane C-C' of FIG. 3A.

Referring to FIGS. 3A-3C, first cobalt cap liners 126 can be formed by selectively growing cobalt from the physically exposed metallic surfaces of the in-process first conductive rails (122, 124) while suppressing growth of cobalt from the physically exposed surfaces of the first dielectric rails 110. Thus, the first cobalt cap liners 126 grow from the top surfaces of the first metallic liners 122 and the first metal fill portions 124. Cobalt can be selectively grown by a chemical vapor deposition process (such as low pressure chemical vapor deposition) employing cyclopentadienylcobalt dicarbonyl (($C_5H_5$)Co(CO)$_2$; commonly referred to as CpCo(CO)$_2$) as a precursor gas. During the chemical vapor deposition process, cyclopentadienylcobalt dicarbonyl gas, argon (Ar) and hydrogen ($H_2$) gases are flown into a CVD reaction chamber to induce reaction between the cyclopentadienylcobalt dicarbonyl gas, argon and hydrogen and resultant deposition of cobalt. The temperature of the chemical vapor deposition process can be in a range from 200 degrees Celsius to 650 degrees Celsius.

Alternatively, other cobalt selective growth processes can be used for selective deposition of cobalt. Exemplary cobalt-containing precursor gases that can be employed in lieu of, or in addition to, cyclopentadienylcobalt dicarbonyl include $Cu(acac)_2$, a combination of $Co(hfac)_2$, $Co(thd)_2$, and $Co_2(CO)_8$. The process conditions including partial pressure of various reactant gases and the deposition temperature can be selected so that growth of cobalt proceeds only from metallic surfaces and does not proceed from dielectric surfaces such as the surfaces of the first dielectric rails 110. In one embodiment, atomic layer deposition or plasma-enhanced chemical vapor deposition (PECVD) may be employed in lieu of low pressure chemical vapor deposition.

The thickness of each first cobalt cap liner 126 can be in a range from 1 nm to 10 nm, such as from 2 nm to 7 nm, although lesser and greater thicknesses can also be employed. Each contiguous combination of an in-process first conductive rail (122, 124) and a first cobalt cap liner 126 constitutes a first conductive rail 12. Thus, each first conductive rail 12 includes a first metallic liner 122, a first metal fill portion 124, and a first cobalt cap liner 126. In one embodiment, each first cobalt cap liner 126 can consist essentially of cobalt or can comprise a cobalt alloy such as a cobalt-tungsten phosphorus (CoWP) alloy, a cobalt-tungsten-nitrogen (CoWN) alloy, or a cobtalt-tungsten-boron-phosphorus (CoWBP) alloy. Further, each first metallic liner 122 can consist essentially of cobalt or the above cobalt alloys, and each first metal fill portion 124 can consist essentially of electroplated copper. As shown in FIG. 3C, each first cobalt cap liner 126 can comprise convex side surfaces 126S that extend along upper edges of the sidewalls of an underlying first metal fill portion 124, a substantially planar top surface 126T that adjoins each of the convex side surfaces 126S, and a substantially planar bottom surface 126B that adjoins each of the convex side surfaces 126S. In one embodiment, the convex surfaces are equidistant from a most proximal upper outer periphery of an underlying first metallic liner 122. In another embodiment, the first cobalt cap liners 126 can be formed only on the first metal fill portions 124. A laterally alternating sequence of first conductive rails 12 and first dielectric rails 110 is formed. Each of the first conductive rails 12 and the first dielectric rails 110 laterally extend along the first horizontal direction hd1.

Figure 4A:
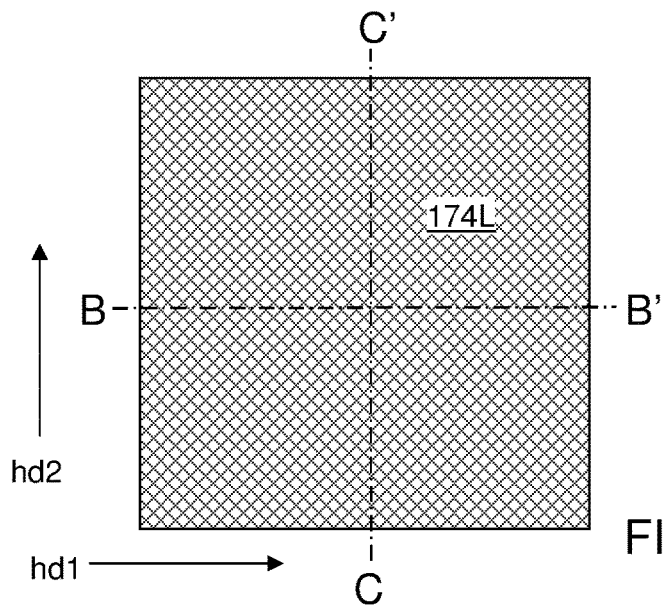
FIG. 4A is a top-down view of the exemplary structure after formation of a first layer stack including first bottom electrode layers, a first resistive memory material layer, a first selector layer, and first top electrode layers according to an embodiment of the present disclosure.
Figure 4B:
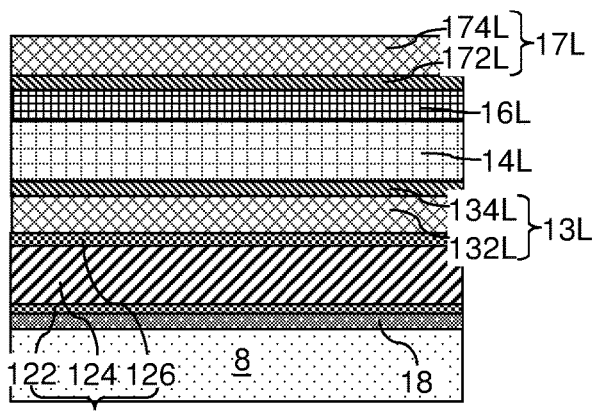
FIG. 4B is a vertical cross-sectional view of the exemplary structure along the vertical plane B-B' of FIG. 4A.
Figure 4C:
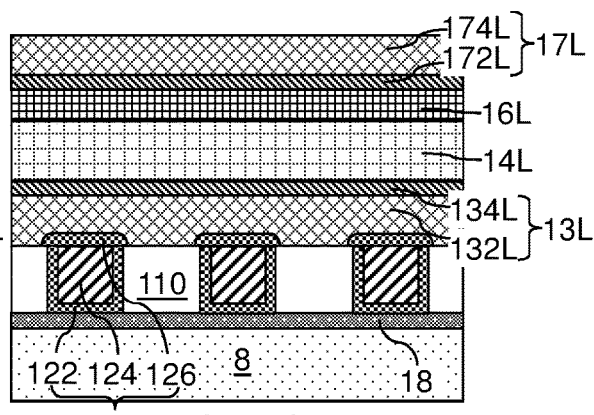
FIG. 4C is a vertical cross-sectional view of the exemplary structure along the vertical plane C-C' of FIG. 4A.

Referring to FIGS. 4A-4C, a first vertical stack (13L, 16L, 14L, 17L), which is also referred to as a first layer stack, is formed over the substrate 8. The first vertical stack (13L, 16L, 14L, 17L) can include a first bottom electrode layer 13L, a first selector layer 14L, a first resistive memory material layer 16L, and a first top electrode layer 17L. Each layer in the first vertical stack (13L, 16L, 14L, 17L) can be formed as a blanket material layer, i.e., an unpatterned material layer that laterally extend along a first horizontal direction hd1 and a second horizontal direction hd2 that is perpendicular to the first horizontal direction hd1.

The first bottom electrode layer 13L includes at least one conductive material layer, which can be at least one metallic material layer. For example, the first bottom electrode layer 13L can include a layer stack, from bottom to top, of a first bottom electrode metal layer 132L (such as a tungsten layer or a titanium layer) and a first bottom electrode metallic nitride layer 134L (such as a tungsten nitride layer, a titanium nitride layer or a tantalum nitride). The thickness of the first bottom electrode metal layer 132L can be in a range from 20 nm to 100 nm, such as from 30 nm to 70 nm, although lesser and greater thicknesses can also be employed. The thickness of the first bottom electrode metallic nitride layer 134L can be in a range from 1 nm to 10 nm, such as from 1.5 nm to 5 nm, although lesser and greater thicknesses can also be employed. The first electrode layer 132L and/or 134L can be planarized by chemical mechanical planarization (CMP) and/or a recess etch process.

In one embodiment, the first selector layer 14L includes at least one threshold switch material layer. The at least one threshold switch material layer includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode).

As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include a first ovonic threshold switch material layer 14L which contains any ovonic threshold switch material. In one embodiment, the first ovonic threshold switch material layer 14L can include, and/or can consist essentially of, a GeSeAs alloy, a GeSe alloy, a SeAs alloy, a GeTe alloy, or a SiTe alloy.

In one embodiment, the material of the first ovonic threshold switch material layer 14L can be selected such that the resistivity of the first ovonic threshold switch material layer 14L decreases at least by two orders of magnitude (i.e., by more than a factor of 100) upon application of an external bias voltage that exceeds a critical bias voltage magnitude (also referred to as threshold voltage). In one embodiment, the composition and the thickness of the first ovonic threshold switch material layer 14L can be selected such that the critical bias voltage magnitude can be in a range from 1 V to 4 V, although lesser and greater voltages can also be employed for the critical bias voltage magnitude. The thickness of the first ovonic threshold switch material layer 14L can be, for example, in a range from 5 nm to 50 nm, such as from 10 nm to 30 nm, although lesser and greater thicknesses can also be employed.

The first resistive memory material layer 16L includes a resistive memory material. As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance. The first resistive memory material layer 16L can include any type of resistive material.

In one embodiment, the resistive memory material layer 16L includes a phase change memory material to form a phase change random access memory ("PCRAM" or "PRAM") device. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the resistive memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the resistive memory material layer 16L can be in a range from 1 nm to 60 nm, such as from 3 nm to 40 nm and/or from 10 nm to 25 nm, although lesser and greater thicknesses can also be employed.

In another embodiment, the first resistive memory material layer 16L includes a barrier modulated cell memory material. For example, oxygen-vacancy-containing metal oxides displaying different electrical conductivity characteristics depending on the level of oxygen vacancies can be deposited for the first resistive memory material layer 16L. An oxygen-vacancy-containing metal oxide can be formed with oxygen deficiencies (e.g., vacancies), or can be annealed to form oxygen deficiencies. One of the electrodes of such a memory device can include a high work function material having a work function greater than 4.5 eV, and can be employed to provide a high potential barrier for electrons at the interface with the reversibly resistance-switching material. As a result, at moderate voltages (below one volt), a very low current will flow through the reversibly resistance-switching material. The energy barrier at the interface between the electrode and the reversibly resistance-switching material can be lowered by the presence of the oxygen vacancies ($V_O^{**}$). In this case, the interface between the electrode and the reversibly resistance-switching material can provide the characteristics of a low resistance contact (Ohmic contact). The oxygen vacancies in the metal oxide of the reversibly resistance-switching material function as n-type dopants, thereby transforming the originally insulating metal oxide into an electrically insulating material having a lower resistivity (but still insulating).

When a large forward bias voltage (such as a negative voltage of about −1.5 volt that is applied to the high work function electrode with respect to the opposing electrode) is applied across the reversibly resistance-switching material, the oxygen vacancies drift toward the interface between the high energy barrier material (such as platinum or n-doped polysilicon) and the reversibly resistance-switching material, and as a result, the potential barrier at the interface between the electrode and the reversibly resistance-switching material is reduced and a relatively high current can flow through the structure. The device is then in its low resistance (conductive) state in which the reversibly resistance-switching material functions as a semiconducting material or a conductive material.

The conductive path can be broken by applying a large reverse bias voltage (such as a positive voltage of about 1.5 volt that is applied to the electrode with respect to the first electrode) across the reversibly resistance-switching material. Under a suitable reverse bias condition, the oxygen vacancies move away from the proximity of the interface between the high work function material and the reversibly resistance-switching material. The resistivity of the reversibly resistance-switching material returns to its high resistance state. Both of the conductive and non-conductive states are non-volatile. Sensing the conduction of the memory storage element (for example, by applying a voltage around 0.5 volts) can easily determine the state of the resistive memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile resistive memory elements include hafnium oxide, such as $HfO_x$ where $1.9<x<2.1$. Suitable materials for the first electrode (e.g., word line) are any conducting material such as Ti(O)N, Ta(O)N, TiN, TiAlN, WN and TaN. Suitable materials for the electrode (e.g., local bit line) include metals and doped semiconductor with a high work function (typically >4.5 eV) capable to getter oxygen in contact with the metal oxide to create oxygen vacancies at the contact. Some examples are TaCN, TiCN, Ru, $RuO_2$, Pt, Ti rich $TiO_x$, TiAlN, TaAlN, TiSiN, TaSiN, $IrO_2$ and doped polysilicon. The thicknesses of the electrodes are typically 1 nm or greater. Thicknesses of the metal oxide can be generally in the range of 2 nm to 20 nm.

In yet another embodiment, the resistive memory material employed for the first resistive memory material layer 16L can include a filamentary metal oxide material such as nickel oxide or $TiO_2$, in which electrically conductive filamentary paths can be formed or removed depending on the external electrical bias conditions. In this case, the first resistive memory material layer 16L can optionally include a first lower conductive liner layer (such as a lower TiN liner) underlying a resistive memory material layer and a first upper conductive liner layer (such as an upper TiN liner) overlying the resistive memory material layer.

In still another embodiment, the resistive memory material employed for the first resistive memory material layer 16L can comprises a stack of material layers for forming a magnetoresistive random access memory (MRAM) device. For example, the first resistive memory material layer 16L can include a stack of material layers including, from bottom to top or from top to bottom, an antiferromagnetic material layer, a magnetic pinned layer, a tunnel barrier, and a magnetic free layer. The magnetic pinned layer can have a fixed horizontal magnetization direction which can be, for example, the first horizontal direction hd1 or the second horizontal direction. The antiferromagnetic material layer provides the function of locking in the magnetization direction of the magnetic pinned layer along the fixed horizontal direction. The tunnel barrier provides spin-sensitive tunneling of electrical currents between the magnetic pinned layer and the magnetic free layer. In other words, the amount of electrical current that passes through the tunnel barrier depends on the relative alignment of magnetization between the magnetic pinned layer and the magnetic free layer, i.e., whether the magnetization directions are parallel or antiparallel to each other. The magnetic free layer can be programmed by external magnetic field to provide a variable magnetization direction.

The first top electrode layer 17L includes at least one conductive material layer, which can be at least one metallic material layer. For example, the first top electrode layer 17L can include a layer stack, from bottom to top, of a first bottom electrode metallic nitride layer 172L (such as a tungsten nitride layer, a titanium nitride layer or a tantalum nitride) and a first bottom electrode metal layer 174L (such as a tungsten layer or a titanium layer). The thickness of the first top electrode metallic nitride layer 172L can be in a range from 1 nm to 10 nm, such as from 1.5 nm to 5 nm, although lesser and greater thicknesses can also be employed. The thickness of the first top electrode metal layer 174L can be in a range from 20 nm to 100 nm, such as from 30 nm to 70 nm, although lesser and greater thicknesses can also be employed.

Referring to FIGS. 5A-5C, an optional hard mask 192 and a second photoresist layer 197 can be applied over the first vertical stack (13L, 14L, 16L, 17L), and can be lithographically patterned to form a line and space pattern. For example, the second photoresist layer 197 can be patterned to form line trenches that laterally extend along the first horizontal direction hd1 and laterally spaced apart along the second horizontal direction hd2. The line trenches can have a uniform width that is invariant with translation along the first horizontal direction hd1. The pattern in the second photoresist layer 197 can be a periodic pattern that is repeated along the second horizontal direction hd2 with a pitch that is equal to the sum of the width of a line trench in the second photoresist layer 197 and the width of a patterned portion of the second photoresist layer 197. The pitch can be in a range from 32 nm to 100 nm, although lesser and greater pitches can also be employed. The pattern in the second photoresist layer 197 can be the complement of the pattern in the first photoresist layer 97. Thus, the patterned second photoresist layer 197 can cover the areas of the first conductive rails 12. An anisotropic etch process is performed employing the patterned portions of the second photoresist layer 197 as an etch mask. The anisotropic etch process etches through portions of the first vertical stack (13L, 14L, 16L, 17L) that are not masked by the second photoresist layer 197. The chemistry of the anisotropic etch process can be sequentially modified to etch through the various material layers of the first vertical stack (13L, 14L, 16L, 17L).

The chemistry of the anisotropic etch process can be selected such that the first top electrode layer 17L, the first resistive memory material layer 16L, the first selector layer 14L, and the first bottom electrode layer 13L are sequentially etched to provide sidewalls that are vertical or substantially vertical, i.e., with a taper angle less than 5 degrees from the vertical direction. The anisotropic etch process can stop at, or below, the top surface of the first dielectric rails 110. Lower first-level isolation trenches 151 laterally extending along the first horizontal direction hd1 are formed by the anisotropic etch. The lower first-level isolation trenches 151 can be line trenches having a uniform vertical cross-sectional shape within vertical planes that are perpendicular to the first horizontal direction hd1. The uniform vertical cross-sectional shape of each lower first-level isolation trench 151 can be invariant with translation along the first horizontal direction hd1. Each lower first-level isolation trench 151 can vertically extend from the horizontal plane including the bottom surface of the second photoresist layer 197 to the horizontal plane including the top surfaces of the first dielectric rails 110. Each lower first-level isolation trench 151 can have a vertical cross-sectional shape of an inverted trapezoid or a rectangle.

Remaining portions of the first vertical stack (13L, 14L, 16L, 17L) include first stacked rail structures (13R, 14R, 16R, 17R), each of which laterally extends along the first horizontal direction hd1. The first stacked rail structures (13R, 14R, 16R, 17R) are laterally spaced apart by the lower first-level isolation trenches 151 along the second horizontal direction hd2. As used herein, a "rail" or a "rail structure" refers to a structure that extends along a lengthwise direction, and optionally with a uniform cross-sectional shape within planes that are perpendicular to the lengthwise direction that is invariant under translation along the lengthwise direction. As used herein, a "stacked rail" or a "stacked rail structure" refers to a contiguous stack of at least two rails that laterally extend along a same lengthwise direction.

Each first stacked rail structure (13R, 14R, 16R, 17R) can include, from bottom to top, a first bottom electrode rail 13R that is a patterned portion of the first bottom electrode layer 13L, a first selector rail 14R that is a patterned portion of the first selector layer 14L, a first resistive memory rail 16R that is a patterned portion of the first resistive memory material layer 16L, a first top electrode rail 17R that is a patterned portion of the first top electrode layer 17L. Each first bottom electrode rail 13R includes a vertical stack of a first bottom electrode metal rail 132R (which is a patterned portion of the first bottom electrode metal layer 132L) and a first bottom electrode metallic nitride rail 134R (which is a patterned portion of a first bottom electrode metallic nitride layer 134L). Each first top electrode rail 17R includes a vertical stack of a first top electrode metallic nitride rail 172R (which is a patterned portion of the first top electrode metallic nitride layer 172L) and a first top electrode metal rail 174R (which is a patterned portion of a first top electrode metal layer 174L).

The first stacked rail structures (13R, 14R, 16R, 17R) laterally extend along the first horizontal direction hd1, are laterally spaced among one another by the lower first-level isolation trenches 151. Sidewalls of the first cobalt cap liners 126 can be physically exposed at bottom peripheral regions of the lower first-level isolation trenches 151. The second photoresist layer 197 can be subsequently removed, for example, by ashing.

Referring to FIGS. 6A-6C, a lower first-level continuous dielectric liner can be optionally deposited on sidewalls and bottom surfaces of the lower first-level isolation trenches 151 and over the first top electrode rails 17R. The lower first-level continuous dielectric liner includes a dielectric material such as silicon nitride, a dielectric metal oxide (such as aluminum oxide), or silicon oxide. The lower first-level continuous dielectric liner can be deposited by a conformal deposition method such as chemical vapor deposition (CVD) or atomic layer deposition (ALD). The thickness of the lower first-level continuous dielectric liner can be in a range from 1 nm to 10 nm, such as from 2 nm to 6 nm, although lesser and greater thicknesses can also be employed.

A lower first-level dielectric fill material layer can be deposited on the lower first-level continuous dielectric liner. The lower first-level dielectric fill material layer includes a planarizable dielectric material such as undoped silicate glass (e.g., silicon oxide), doped silicate glass, or a spin-on glass (SOG), or a low-k dielectric material. The lower first-level dielectric fill material layer can be deposited by a conformal deposition method or by a self-planarizing deposition method (such as spin coating). In one embodiment, the lower first-level continuous dielectric liner can include, and/or can consist essentially of, a material selected from silicon nitride and a dielectric metal oxide, and the lower first-level dielectric fill material layer can include, and/or can consist essentially of, a material selected from doped silicate glass and undoped silicate glass.

Portions of the lower first-level continuous dielectric liner and the lower first-level dielectric fill material layer can be removed from above the horizontal plane including top surfaces of the first top electrode rails 17R by a planarization process. The planarization process can include chemical mechanical planarization (CMP) and/or a recess etch process. Each remaining portion of the lower first-level continuous dielectric liner constitutes a lower first-level dielectric liner 152R, and each remaining portion of the lower first-level dielectric fill material layer constitutes a lower first-level dielectric fill material rail 154R. Each contiguous set of a lower first-level dielectric liner 152R and a lower first-level dielectric fill material rail 154R constitutes an in-process first-level dielectric isolation structure (152R, 154R), which is a dielectric isolation structure having a shape of a rail. An in-process first-level dielectric isolation structure (152R, 154R) is formed in each of the lower first-level isolation trenches 151 as a rail structure. The in-process first-level dielectric isolation structures (152R, 154R) laterally extend along the first horizontal direction hd1, and are laterally spaced among one another along the second horizontal direction hd2. The top surfaces of the in-process first-level dielectric isolation structures (152R, 154R) can be coplanar with the top surfaces of the first top electrode rails 17R. The first resistive memory material layer 16L is divided into first memory material rails 16R by the in-process first-level dielectric isolation structures (152R, 154R).

Figure 7A:
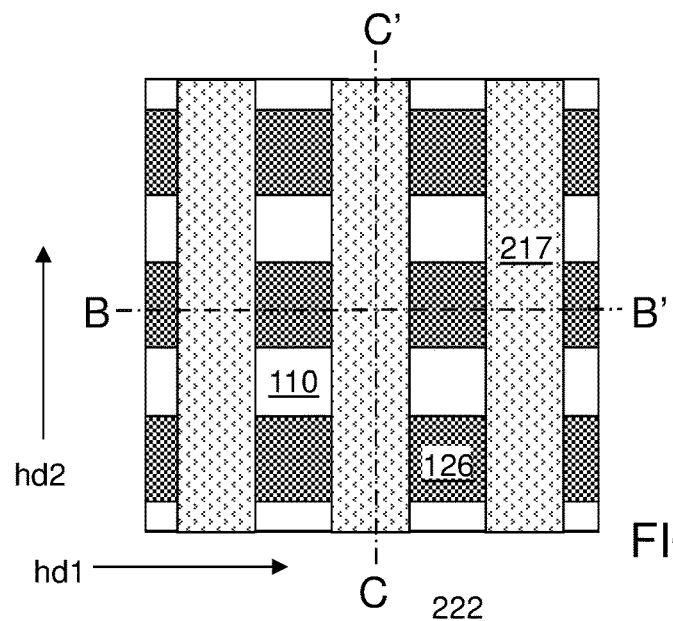
FIG. 7A is a top-down view of the exemplary structure after formation of a first sacrificial material layer and forming upper first-level isolation trenches through the first sacrificial material layer and the in-process first-level dielectric isolation structures according to an embodiment of the present disclosure.
Figures 7B, 7C:
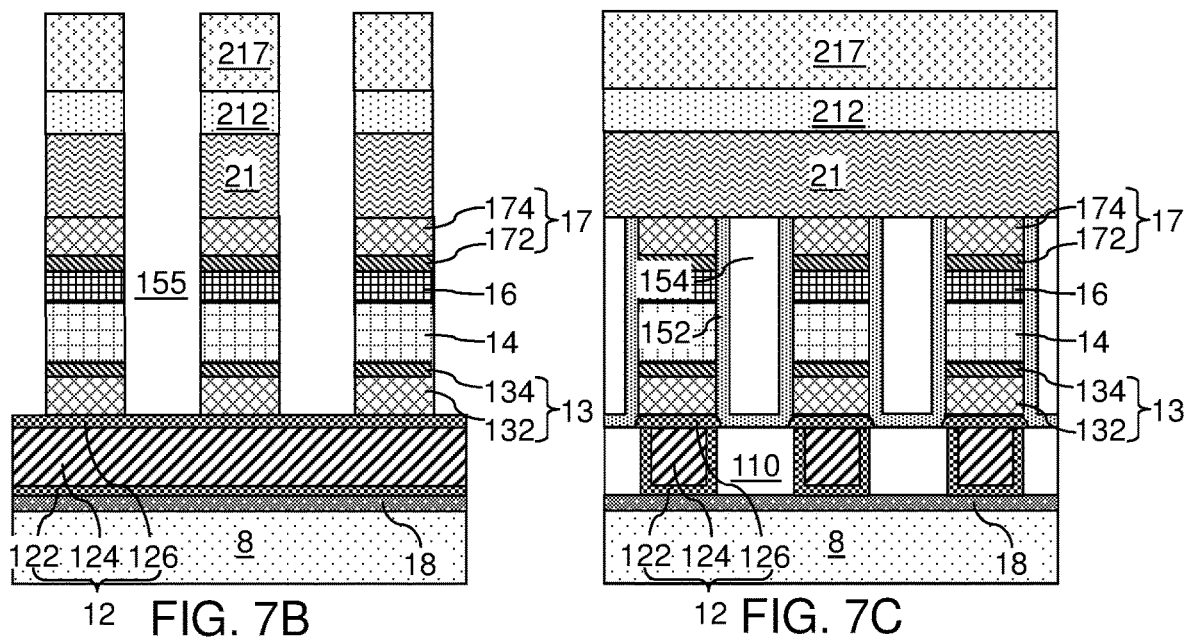
FIG. 7B is a vertical cross-sectional view of the exemplary structure along the vertical plane B-B' of FIG. 7A.
FIG. 7C is a vertical cross-sectional view of the exemplary structure along the vertical plane C-C' of FIG. 7A.

Referring to FIGS. 7A-7C, a first sacrificial material layer, a second hard mask layer, and a third photoresist layer 217 can be formed over the one-dimensional array of first stacked rail structures (13R, 14R, 16R, 17R) spaced by the in-process first-level dielectric isolation structures (152R, 154R). The first sacrificial material layer and the second hard mask layer are subsequently patterned to form first sacrificial material strips 21 and the second hard mask strips 212, as will be described below. The first sacrificial material layer includes a sacrificial material that can be removed selective to the materials of the first top electrode rails 17R and the in-process first-level dielectric isolation structures (152R, 154R). For example, the first sacrificial material layer can include amorphous silicon or amorphous carbon. The thickness of the first sacrificial material layer can be in a range from 20 nm to 100 nm, such as from 30 nm to 70 nm, although lesser and greater thicknesses can also be employed.

The second hard mask layer includes a hard mask material such as silicon nitride or a dielectric metal oxide (such as aluminum oxide). The thickness of the second hard mask layer can be in a range from 10 nm to 100 nm, such as from 20 nm to 50 nm, although lesser and greater thicknesses can also be employed. Alternatively, the second hard mask layer can include two or more materials, for example silicon nitride, silicon oxide, amorphous silicon or amorphous carbon, to apply a double patterning process.

The third photoresist layer 217 can be patterned with a line and space pattern. Patterned portions of the third photoresist layer 217 laterally extend along the second horizontal direction hd2 with a respective uniform width. Thus, line trenches are present among the patterned portions of the third photoresist layer 217. The line trenches laterally extend along the second horizontal direction hd2, and are laterally spaced apart along the first horizontal direction hd1. The line trenches can have a uniform width that is invariant with translation along the second horizontal direction hd2. The pattern in the third photoresist layer 217 can be a periodic pattern that is repeated along the first horizontal direction hd1 with a pitch that is equal to the sum of the width of a line trench in the third photoresist layer 217 and the width of a patterned line-shaped portion of the third photoresist layer 217. The pitch can be in a range from 32 nm to 100 nm, although lesser and greater pitches can also be employed.

Upper first-level isolation trenches 155 are formed through the first sacrificial material layer, the second hard mask layer, the first stacked rail structures (13R, 14R, 16R, 17R), and the in-process first-level dielectric isolation structures (152R, 154R). An anisotropic etch process can be performed to etch portions of the first sacrificial material layer, the second hard mask layer, the first top electrode rails 17R, the first selector rails 14R, the first resistive memory rails 16R, the first bottom electrode rails 13R, and the in-process first-level dielectric isolation structures (152R, 154R) that are not masked by the third photoresist layer 217. Volumes from which the materials of the first sacrificial material layer, the second hard mask layer, the first top electrode rails 17R, the first selector rails 14R, the first resistive memory rails 16R, the first bottom electrode rails 13R, and the in-process first-level dielectric isolation structures (152R, 154R) are removed constitute the upper first-level isolation trenches 155. The upper first-level isolation trenches 155 laterally extend along the second horizontal direction hd2.

The chemistry of the anisotropic etch process can be sequentially modified to etch through the various materials of the first sacrificial material layer, the second hard mask layer, the first top electrode rails 17R, the first selector rails 14R, the first resistive memory rails 16R, the first bottom electrode rails 13R, and the in-process first-level dielectric isolation structures (152R, 154R). The anisotropic etch process can stop at the top surface of, or within, the first cobalt cap liners 126 and the first dielectric rails 110. The upper first-level isolation trenches 155 can be line trenches extending along the second horizontal direction hd2 having a respective vertically undulating bottom surface. Each upper first-level isolation trench 155 can vertically extend from the horizontal plane including the bottom surface of the third photoresist layer 217 to the top surface of the first cobalt cap liners 126 and the first dielectric rails 110.

The second hard mask layer is divided into second hard mask strips 212. The first sacrificial material layer is divided into a one-dimensional array of first sacrificial material rails 21. Each vertical stack of a first top electrode rail 17R, a first resistive memory rails 16R, a first selector rails 14R, and a first bottom electrode rail 13R is divided into a row of first memory pillar structures (13, 14, 16, 17) that are laterally spaced apart long the first horizontal direction hd1. The combination of the first top electrode rails 17R, the first resistive memory rails 16R, the first selector rails 14R, and the first bottom electrode rails 13R is divided into a two-dimensional array of first memory pillar structures (13, 14, 16, 17), which may be a periodic two-dimensional array. The two-dimensional array of first memory pillar structures (13, 14, 16, 17) can form a rectangular periodic two-dimensional array having a first pitch along the first horizontal direction hd1 and a second pitch along the second horizontal direction hd2.

As used herein, a "pillar" or a "pillar structure" refers to a structure that extends along a vertical direction. Sidewalls of a pillar structure may be vertical, substantially vertical, or tapered. As used herein, a sidewall is "substantially vertical" if the sidewall is tapered, i.e., tilted, with respect to a vertical direction by a tilt angle that is less than 5 degrees.

Each first memory pillar structure (13, 14, 16, 17) can include, from bottom to top, a first bottom electrode 13 that is a patterned portion of a first bottom electrode rail 13R, a first selector pillar 14 that is a patterned portion of a first selector rail 14R, a first resistive memory element 16 that is a patterned portion of a resistive memory rail 16R, and a first upper electrode 17 that is a patterned portion of a first top electrode rail 17R. Each first bottom electrode 13 can include a vertical stack of a first bottom electrode metal plate 132 (which is a patterned portion of a first bottom electrode metal rail 132R) and a first bottom electrode metallic nitride portion 134 (which is a patterned portion of a first bottom electrode metallic nitride rail 134R). Each first top electrode 17 includes a vertical stack of a first top electrode metallic nitride portion 172 (which is a patterned portion of a first top electrode metallic nitride rail 172R) and a first top electrode metal portion 174 (which is a patterned portion of a first top electrode metal rail 174R).

Each first resistive memory element 16 can include a phase change memory material, an oxygen-vacancy-containing metal oxide, a filamentary metal oxide or an MRAM stack. Each first selector pillar 14 is a selector element, i.e., an element that provides non-linear voltage-current characteristics such that the element functions as a conductor under first voltage bias conditions and as an insulator under second voltage bias conditions. In one embodiment, if the first resistive memory element 16 is a phase change memory material, then each first selector pillar 14 can include a first ovonic threshold switch material portion that is a patterned portion of a first selector rail 14R.

Each in-process first-level dielectric isolation structure (152R, 154R) is divided into a row of discrete dielectric material structures, which are herein referred to as first dielectric isolation pillars (152, 154). Each first dielectric isolation pillar (152, 154) comprises a first dielectric pillar liner 152 (which is a U-shaped patterned portion of a lower first-level dielectric liner 152R) and a first dielectric pillar fill structure 154 (which is a patterned portion of a lower first-level dielectric fill material rail 154R). The first dielectric isolation pillars (152, 154) can be arranged as a two-dimensional array, which may be a two-dimensional periodic rectangular array. The third photoresist layer 217 can be subsequently removed, for example, by ashing. The second hard mask strips 212 can be subsequently removed by an isotropic etch process.

Referring to FIGS. 8A-8C, an upper first-level continuous dielectric liner can be optionally deposited on sidewalls and bottom surfaces of the upper first-level isolation trenches 155 and over the first sacrificial material rails 21. The upper first-level continuous dielectric liner includes a dielectric material such as silicon nitride, a dielectric metal oxide (such as aluminum oxide), or silicon oxide. The upper first-level continuous dielectric liner can be deposited by a conformal deposition method such as chemical vapor deposition (CVD) or atomic layer deposition (ALD). The thickness of the upper first-level continuous dielectric liner can be in a range from 1 nm to 10 nm, such as from 2 nm to 6 nm, although lesser and greater thicknesses can also be employed.

An upper first-level dielectric fill material layer can be deposited on the upper first-level continuous dielectric liner. The upper first-level dielectric fill material layer includes a planarizable dielectric material such as undoped silicate glass (e.g., silicon oxide), doped silicate glass, a spin-on glass (SOG), or a low-k dielectric material. The upper first-level dielectric fill material layer can be deposited by a conformal deposition method or by a self-planarizing deposition method (such as spin coating). In one embodiment, the upper first-level continuous dielectric liner can include, and/or can consist essentially of, a material selected from silicon nitride and a dielectric metal oxide, and the upper first-level dielectric fill material layer can include, and/or can consist essentially of, a material selected from doped silicate glass and undoped silicate glass.

Portions of the upper first-level continuous dielectric liner and the upper first-level dielectric fill material layer can be removed from above the horizontal plane including top surfaces of the first sacrificial material rails 21 by a planarization process. The planarization process can include chemical mechanical planarization (CMP) and/or a recess etch process. Each remaining portion of the upper first-level continuous dielectric liner constitutes an upper first-level dielectric liner 156R, and each remaining portion of the upper first-level dielectric fill material layer constitutes an upper first-level dielectric fill material rail 158R. Each contiguous set of an upper first-level dielectric liner 156R and an upper first-level dielectric fill material rail 158R constitutes a first dielectric isolation rail (156R, 158R), which is a dielectric isolation structure having a shape of a rail. The first dielectric isolation rail (156R, 158R) is formed in each of the upper first-level isolation trenches 155 as a rail structure. The first dielectric isolation rails (156R, 158R) laterally extend along the second horizontal direction hd2, and are laterally spaced among one another along the first horizontal direction hd1. The top surfaces of the first dielectric isolation rails (156R, 158R) can be coplanar with the top surfaces of the first sacrificial material rails 21.

Figure 9A:
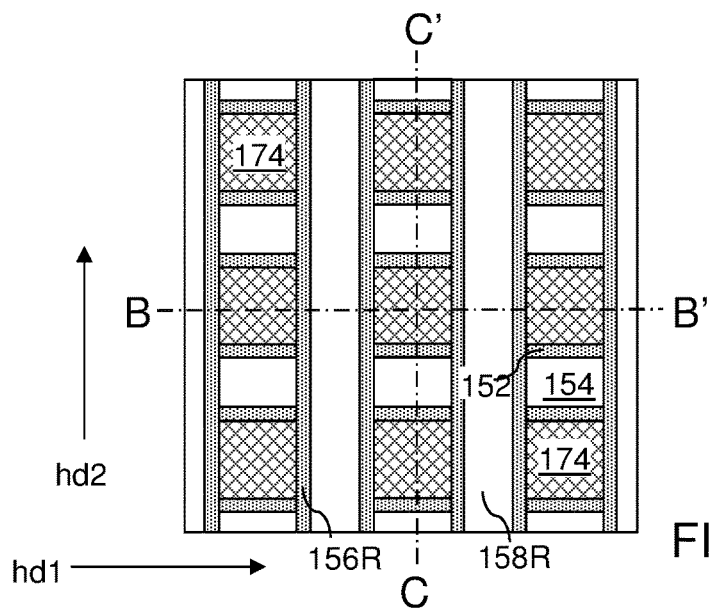
FIG. 9A is a top-down view of the exemplary structure after formation of second line trenches by removal of first sacrificial material rails according to an embodiment of the present disclosure.
Figure 9B:
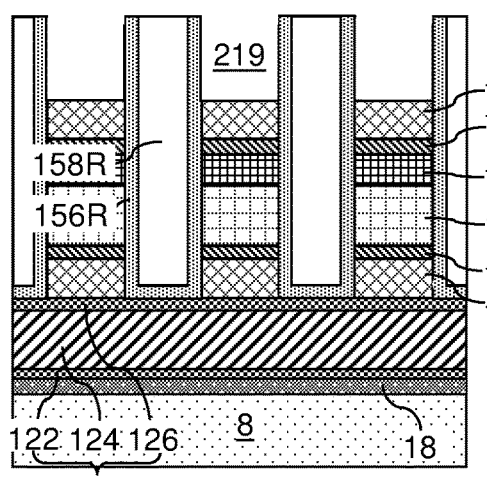
FIG. 9B is a vertical cross-sectional view of the exemplary structure along the vertical plane B-B' of FIG. 9A.
Figure 9C:
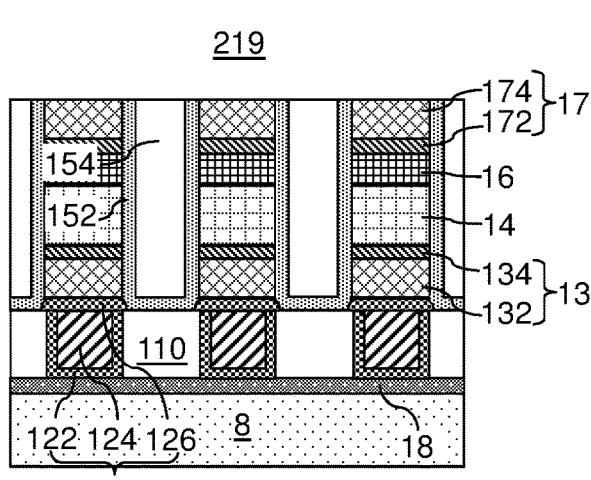
FIG. 9C is a vertical cross-sectional view of the exemplary structure along the vertical plane C-C' of FIG. 9A.

Referring to FIGS. 9A-9C, second line trenches 219 are formed by selective removal of the first sacrificial material rails 21 without removing the first dielectric isolation rails (156R, 158R) or the first top electrodes 17. For example, if the first sacrificial material rails 21 include amorphous silicon, a wet etch process employing hot trimethyl-2 hydroxyethyl ammonium hydroxide ("hot TMY") or tetramethyl ammonium hydroxide (TMAH) can be performed to isotropically etch the first sacrificial material rails 21. If the first sacrificial material rails 21 include amorphous carbon, an ashing process can be performed to remove the first sacrificial material rails 21. The second line trenches 219 are formed in volumes from which the first sacrificial material rails 21 are removed.

Figure 10A:
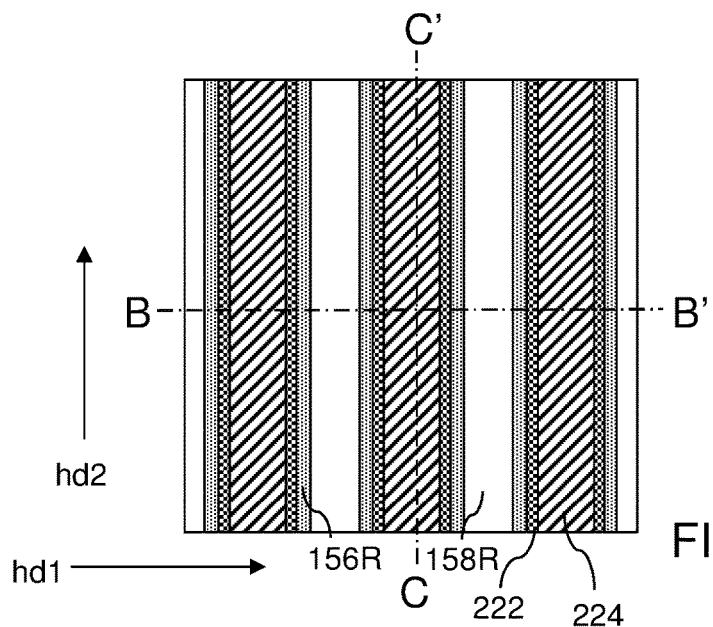
FIG. 10A is a top-down view of the exemplary structure after formation of in-process second conductive rails according to an embodiment of the present disclosure.
Figures 10B, 10C:
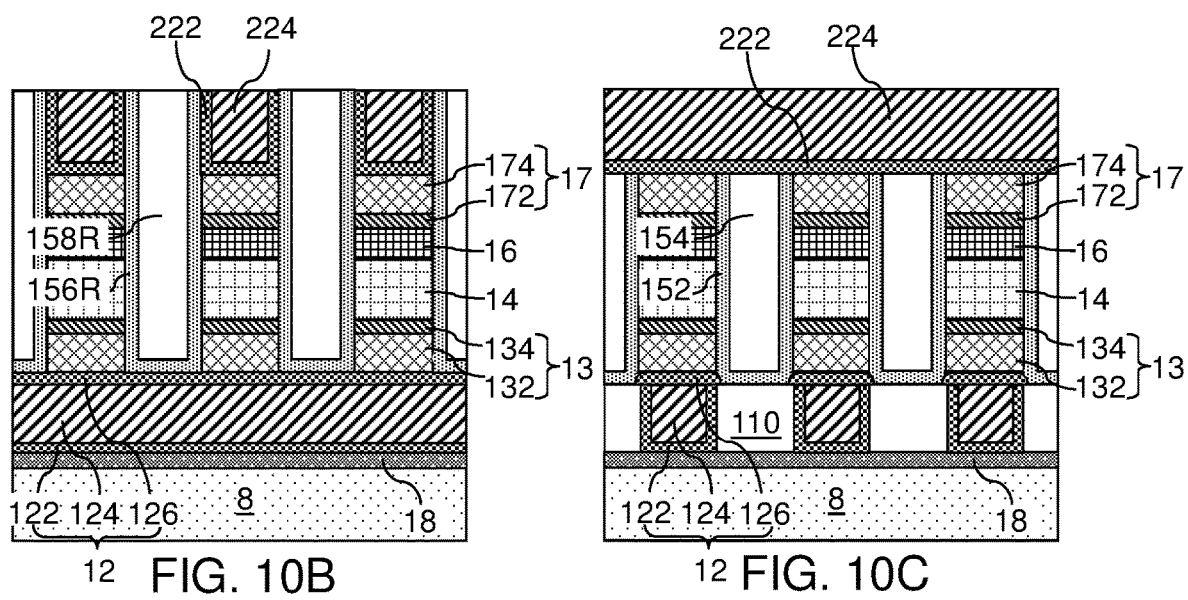
FIG. 10B is a vertical cross-sectional view of the exemplary structure along the vertical plane B-B' of FIG. 10A.
FIG. 10C is a vertical cross-sectional view of the exemplary structure along the vertical plane C-C' of FIG. 10A.

Referring to FIGS. 10A-10C, in-process second conductive rails (222, 224) are formed within each second line trench 219 by deposition and planarization of at least one second metallic material. For example, a second metallic liner material and a second metal fill material can be sequentially formed in the second line trenches 219. The second metallic liner material can include cobalt, ruthenium or molybdenum. The second metallic liner material can be the same as, or different from, the first metallic liner material. In one embodiment, the second metallic liner material can consist essentially of cobalt or can comprise a cobalt alloy such as a cobalt-tungsten phosphorus (CoWP) alloy, a cobalt-tungsten-nitrogen (CoWN) alloy, or a cobtalt-tungsten-boron-phosphorus (CoWBP) alloy. In another embodiment, the first metallic liner material can consist of ruthenium, a ruthenium alloy such as RuTiN, RuSi, RuTa, RuN, or molybdenum or a molybdenum alloy such as MoN, MoSi, MoSiN. The second metallic liner material can be deposited non-selectively by a conformal deposition or a non-conformal deposition. For example, the second metallic liner material can be deposited by physical vapor deposition (PVD), chemical vapor deposition (CVD) or atomic layer deposition (ALD). The thickness of the second metallic liner material can be in a range from 2 nm to 20 nm, such as from 2.5 nm to 5 nm, although lesser and greater thicknesses can also be employed. The second metal fill material can include copper or a copper-based metallic fill material including copper at an atomic concentration greater than 90%, which may be greater than 95% and/or 99%. The second metal fill material can consist essentially copper of a copper-based metallic fill material (e.g., a copper alloy). In one embodiment, the second metal fill material can include copper that is deposited by electroplating. In another embodiment, the first metallic liner and the first metal fill material can consist of the same material, for example cobalt, ruthenium, molybdenum, a cobalt alloy, a ruthenium alloy, a molybdenum alloy, copper or a copper based metallic material The second metal fill material and the second metallic liner material can be subsequently planarized by a planarization process, which can employ chemical mechanical planarization (CMP) and/or a recess etch. Top surfaces of the remaining portions of the second metal fill material and the second metallic liner material can be formed at, or near, the level of the top surface of the first dielectric isolation rails (156R, 158R).

Each remaining portion of the second metallic liner material constitutes a second metallic liner 222. Each remaining portion of the second metal fill material constitutes a second metal fill material portion 224. Each pair of a second metallic liner 222 and a second metal fill material portion 224 filling a second line trench 219 constitutes an in-process second conductive rail (222, 224). The in-process second conductive rails (222, 224) laterally extend along the second horizontal direction hd2 and are laterally spaced apart along the first horizontal direction hd1 by the first dielectric isolation rails (156R, 158R). A laterally alternating sequence of in-process second conductive rails (222, 224) and first dielectric isolation rails (156R, 158R) is formed. Each of the in-process second conductive rails (222, 224) and the first dielectric isolation rails (156R, 158R) laterally extend along the second horizontal direction hd2. Each of the in-process second conductive rails (222, 224) comprises a second metallic liner 222 surrounding on three sides, and contacting sidewalls and a bottom surface of, a second metal fill portion 224. In one embodiment, the second metal fill portions 224 comprise copper atoms at an atomic concentration greater than 90%. In one embodiment, the top surfaces of the in-process second conductive rails (222, 224) and the first dielectric isolation rails (156R, 158R) may be formed within a same horizontal plane.

The processing steps of FIGS. 9A-9C and 10A-10C provide replacement of the first sacrificial material rails 21 with conductive material portions which constitute the in-process second conductive rails (222, 224). The in-process second conductive rails (222, 224) are subsequently incorporated into second conductive rails. The in-process second conductive rails (222, 224) extend along the second horizontal direction hd2 and overlie top surfaces of the rectangular array of first memory pillar structures (13, 14, 16, 17).

Figure 11A:
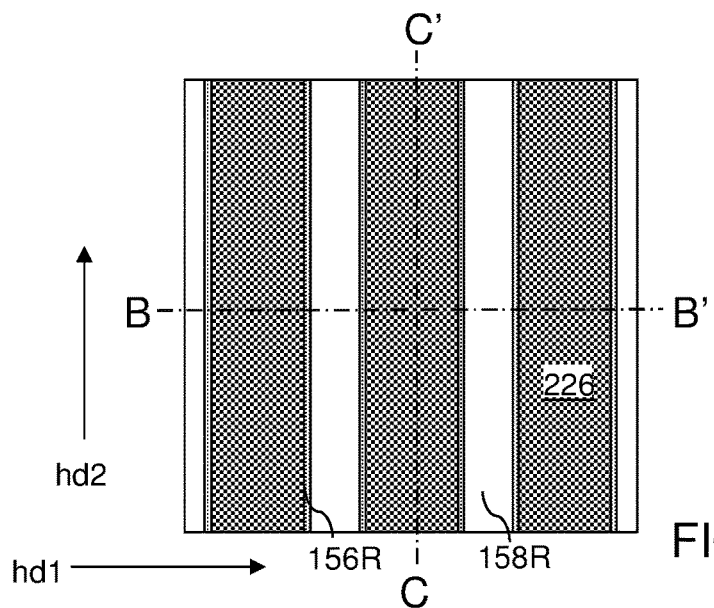
FIG. 11A is a top-down view of the exemplary structure after selective growth of second cobalt cap liners according to an embodiment of the present disclosure.
Figure 11B:
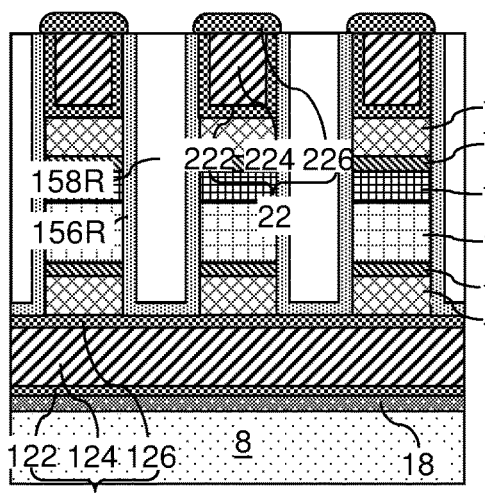
FIG. 11B is a vertical cross-sectional view of the exemplary structure along the vertical plane B-B' of FIG. 11A.
Figure 11C:
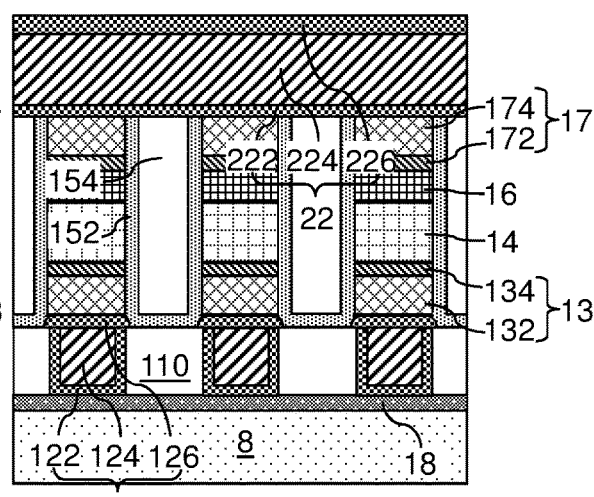
FIG. 11C is a vertical cross-sectional view of the exemplary structure along the vertical plane C-C' of FIG. 11A.

Referring to FIGS. 11A-11C, second cobalt cap liners 226 can be formed by selectively growing cobalt from the physically exposed metallic surfaces of the in-process second conductive rails (222, 224) while suppressing growth of cobalt from the physically exposed surfaces of the first dielectric isolation rails (156R, 158R). Thus, the second cobalt cap liners 226 grow from the top surfaces of the second metallic liners 222 and the second metal fill portions 224. Cobalt can selectively grown by a chemical vapor deposition process, similar to the one described previously (e.g., such by as low pressure chemical vapor deposition employing $CpCo(CO)_2$, $Cu(acac)_2$, or a combination of $Co(hfac)_2$, $Co(thd)_2$, and $Co_2(CO)_8$ as a precursor gas.

The process conditions including partial pressure of various reactant gases and the deposition temperature can be selected so that growth of cobalt proceeds only from metallic surfaces and does not proceed from dielectric surfaces such as the surfaces of the first dielectric isolation rails (156R, 158R). In one embodiment, atomic layer deposition or plasma-enhanced chemical vapor deposition (PECVD) may be employed in lieu of low pressure chemical vapor deposition.

Each second cobalt cap liner 226 can comprise convex surfaces that extend along upper edges of the sidewalls of an underlying second metal fill portion 224, a top surface that adjoins each of the convex surfaces, and a bottom surface that adjoins each of the convex surfaces. In one embodiment, the convex surfaces are equidistant from a most proximal upper outer periphery of an underlying second metallic liner 222. In one embodiment, the convex surfaces are equidistant from a most proximal upper outer periphery of an underlying first metallic liner 222. The thickness of each second cobalt cap liner 226 can be in a range from 2 nm to 20 nm, such as from 2 nm to 7 nm, although lesser and greater thicknesses can also be employed. Each contiguous combination of an in-process second conductive rail (222, 224) and a second cobalt cap liner 226 constitutes a second conductive rail 22. Thus, each second conductive rail 22 includes a second metallic liner 222, a second metal fill portion 224, and a second cobalt cap liner 226. In one embodiment, each second cobalt cap liner 226 can consist essentially of cobalt or cobalt alloy described above. Further, each second metallic liner 222 can consist essentially of cobalt or cobalt alloy, ruthenium or a ruthenium alloy, or molybdenum or a molybdenum alloy described above, and each second metal fill portion 224 can consist essentially of electroplated copper. In another embodiment, the second cobalt cap liners 226 can be formed only on the second metal fill portions 224. A laterally alternating sequence of second conductive rails 22 and first dielectric isolation rails (156R, 158R) is formed. Each of the second conductive rails 22 and the first dielectric isolation rails (156R, 158R) laterally extend along the second horizontal direction hd2. The set of structural elements overlying the laterally alternating sequence of the first conductive rails 12 and the first dielectric rails 110 after the processing steps of FIGS. 11A-11C is herein referred to as a first-tier structure.

Referring to FIGS. 12A-12C, a second vertical stack (23L, 26L, 24L, 27L), which is also referred to as a second layer stack, is formed over first-tier structure. The second vertical stack (23L, 26L, 24L, 27L) can include a second bottom electrode layer 23L, a second selector layer 24L, a second resistive memory material layer 26L, and a second top electrode layer 27L. Each layer in the second vertical stack (23L, 26L, 24L, 27L) can be formed as a blanket material layer, i.e., an unpatterned material layer that laterally extend along the first horizontal direction hd1 and the second horizontal direction hd2.

The second bottom electrode layer 23L includes at least one conductive material layer, which can be at least one metallic material layer. For example, the second bottom electrode layer 23L can include a layer stack, from bottom to top, of a second bottom electrode metal layer 232L (such as a tungsten layer or a titanium layer) and a second bottom electrode metallic nitride layer 234L (such as a tungsten nitride layer, a titanium nitride layer or a tantalum nitride) The thickness of the second bottom electrode metal layer 232L can be in a range from 20 nm to 200 nm, such as from 30 nm to 70 nm, although lesser and greater thicknesses can also be employed. The thickness of the second bottom electrode metallic nitride layer 234L can be in a range from 2 nm to 20 nm, such as from 2.5 nm to 5 nm, although lesser and greater thicknesses can also be employed. The first electrode layer 223L and/or 234L can be planarized by chemical mechanical planarization (CMP) and/or a recess etch process.

The second selector layer 24L includes a non-Ohmic material. The second selector layer 24L can include any of the materials that can be employed for the first selector layer 14L, and can have the same thickness range as the first selector layer 14L.

The second resistive memory material layer 26L includes a resistive memory material. The second resistive memory material layer 26L can include any of the materials or material stacks that can be employed for the first resistive memory material layer 16L, and can have the same thickness range as the first resistive memory material layer 16L.

The second top electrode layer 27L includes at least one conductive material layer, which can be at least one metallic material layer. For example, the second top electrode layer 27L can include a layer stack, from bottom to top, of a second bottom electrode metallic nitride layer 272L (such as a tungsten nitride layer, a titanium nitride layer or a tantalum nitride) and a second bottom electrode metal layer 274L (such as a tungsten layer or a titanium layer). The thickness of the second top electrode metallic nitride layer 272L can be in a range from 2 nm to 20 nm, such as from 2.5 nm to 5 nm, although lesser and greater thicknesses can also be employed. The thickness of the second top electrode metal layer 274L can be in a range from 20 nm to 200 nm, such as from 30 nm to 70 nm, although lesser and greater thicknesses can also be employed.

Referring to FIGS. 13A-13C, another optional hard mask layer 292 and fourth photoresist layer 297 can be applied over the second vertical stack (23L, 24L, 26L, 27L), and can be lithographically patterned to form a line and space pattern. For example, the fourth photoresist layer 297 can be patterned to form line trenches that laterally extend along the second horizontal direction hd2 and laterally spaced apart along the first horizontal direction hd1. The line trenches can have a uniform width that is invariant with translation along the second horizontal direction hd2. The pattern in the fourth photoresist layer 297 can be a periodic pattern that is repeated along the first horizontal direction hd1 with a pitch that is equal to the sum of the width of a line trench in the fourth photoresist layer 297 and the width of a patterned portion of the fourth photoresist layer 297. The pitch can be in a range from 32 nm to 100 nm, although lesser and greater pitches can also be employed. The pattern in the fourth photoresist layer 297 can be the complement of the pattern in the third photoresist layer 217. Thus, the patterned fourth photoresist layer 297 can cover all, or a predominant fraction, of the areas of the second conductive rails 22.

An anisotropic etch process is performed employing the patterned portions of the fourth photoresist layer 297 as an etch mask. The anisotropic etch process etches through portions of the second vertical stack (23L, 24L, 26L, 27L) that are not masked by the fourth photoresist layer 297. The chemistry of the anisotropic etch process can be sequentially modified to etch through the various material layers of the second vertical stack (23L, 24L, 26L, 27L).

The chemistry of the anisotropic etch process can be selected such that the second top electrode layer 27L, the second resistive memory material layer 26L, the second selector layer 24L, and the second bottom electrode layer 23L are sequentially etched to provide sidewalls that are vertical or substantially vertical, i.e., with a taper angle less than 5 degrees from the vertical direction. The anisotropic etch process can stop at, or below, the top surface of the first dielectric isolation rails (156R, 158R). Lower second-level isolation trenches 251 laterally extending along the second horizontal direction hd2 are formed by the anisotropic etch. The lower second-level isolation trenches 251 can be line trenches having a uniform vertical cross-sectional shape within vertical planes that are perpendicular to the second horizontal direction hd2. The uniform vertical cross-sectional shape of each lower second-level isolation trench 251 can be invariant with translation along the second horizontal direction hd2. Each lower second-level isolation trench 251 can vertically extend from the horizontal plane including the bottom surface of the fourth photoresist layer 297 to the horizontal plane including the top surface of the first dielectric isolation rails (156R, 158R). Each lower second-level isolation trench 251 can have a vertical cross-sectional shape of an inverted trapezoid or a rectangle.

Remaining portions of the second vertical stack (23L, 24L, 26L, 27L) include second stacked rail structures (23R, 24R, 26R, 27R), each of which laterally extends along the second horizontal direction hd2. The second stacked rail structures (23R, 24R, 26R, 27R) are laterally spaced apart by the lower second-level isolation trenches 251 along the first horizontal direction hd1.

Each second stacked rail structure (23R, 24R, 26R, 27R) can include, from bottom to top, a second bottom electrode rail 23R that is a patterned portion of the second bottom electrode layer 23L, a second selector rail 24R that is a patterned portion of the second selector layer 24L, a second resistive memory rail 26R that is a patterned portion of the second resistive memory material layer 26L, a second top electrode rail 27R that is a patterned portion of the second top electrode layer 27L. Each second bottom electrode rail 23R includes a vertical stack of a second bottom electrode metal rail 232R (which is a patterned portion of the second bottom electrode metal layer 232L) and a second bottom electrode metallic nitride rail 234R (which is a patterned portion of a second bottom electrode metallic nitride layer 234L). Each second top electrode rail 27R includes a vertical stack of a second top electrode metallic nitride rail 272R (which is a patterned portion of the second top electrode metallic nitride layer 272L) and a second top electrode metal rail 274R (which is a patterned portion of a second top electrode metal layer 274L).

The second stacked rail structures (23R, 24R, 26R, 27R) laterally extend along the second horizontal direction hd2, are laterally spaced among one another by the lower second-level isolation trenches 251. Sidewalls of the second cobalt cap liners 226 can be physically exposed at bottom peripheral regions of the lower second-level isolation trenches 251. The fourth photoresist layer 297 can be subsequently removed, for example, by ashing. In one embodiment, a fourth hard mask layer 292 can be employed. The fourth hard mask layer can include one or more materials to apply a double patterning process to shrink the width of the lower second-level isolation trenches 251.

Referring to FIGS. 14A-14C, a lower second-level continuous dielectric liner can be optionally deposited on sidewalls and bottom surfaces of the lower second-level isolation trenches 251 and over the second top electrode rails 27R. The lower second-level continuous dielectric liner includes a dielectric material such as silicon nitride, a dielectric metal oxide (such as aluminum oxide), or silicon oxide. The lower second-level continuous dielectric liner can be deposited by a conformal deposition method such as chemical vapor deposition (CVD) or atomic layer deposition (ALD). The thickness of the lower second-level continuous dielectric liner can be in a range from 2 nm to 20 nm, such as from 2 nm to 6 nm, although lesser and greater thicknesses can also be employed.

A lower second-level dielectric fill material layer can be deposited on the lower second-level continuous dielectric liner. The lower second-level dielectric fill material layer includes a planarizable dielectric material such as undoped silicate glass (e.g., silicon oxide), doped silicate glass, a spin-on glass (SOG), or a low-k dielectric material. The lower second-level dielectric fill material layer can be deposited by a conformal deposition method or by a self-planarizing deposition method (such as spin coating). In one embodiment, the lower second-level continuous dielectric liner can include, and/or can consist essentially of, a material selected from silicon nitride and a dielectric metal oxide, and the lower second-level dielectric fill material layer can include, and/or can consist essentially of, a material selected from doped silicate glass and undoped silicate glass.

Portions of the lower second-level continuous dielectric liner and the lower second-level dielectric fill material layer can be removed from above the horizontal plane including top surfaces of the second top electrode rails 27R by a planarization process. The planarization process can include chemical mechanical planarization (CMP) and/or a recess etch process. Each remaining portion of the lower second-level continuous dielectric liner constitutes a lower second-level dielectric liner 252R, and each remaining portion of the lower second-level dielectric fill material layer constitutes a lower second-level dielectric fill material rail 254R. Each contiguous set of a lower second-level dielectric liner 252R and a lower second-level dielectric fill material rail 254R constitutes an in-process second-level dielectric isolation structure (252R, 254R), which is a dielectric isolation structure having a shape of a rail. An in-process second-level dielectric isolation structure (252R, 254R) is formed in each of the lower second-level isolation trenches 251 as a rail structure. The in-process second-level dielectric isolation structures (252R, 254R) laterally extend along the second horizontal direction hd2, and are laterally spaced among one another along the first horizontal direction hd1. The top surfaces of the in-process second-level dielectric isolation structures (252R, 254R) can be coplanar with the top surfaces of the second top electrode rails 27R. The second resistive memory material layer 26L is divided into second memory material rails 26R by the in-process second-level dielectric isolation structures (252R, 254R).

Referring to FIGS. 15A-15C, a second sacrificial material layer, a third hard mask layer, and a fifth photoresist layer 317 can be formed over the one-dimensional array of second stacked rail structures (23R, 24R, 26R, 27R) spaced by the in-process second-level dielectric isolation structures (252R, 254R). The second sacrificial material layer includes a sacrificial material that can be removed selective to the materials of the second top electrode rails 27R and the in-process second-level dielectric isolation structures (252R, 254R). For example, the second sacrificial material layer can include amorphous silicon or amorphous carbon. The thickness of the second sacrificial material layer can be in a range from 20 nm to 200 nm, such as from 30 nm to 70 nm, although lesser and greater thicknesses can also be employed.

The third hard mask layer includes a hard mask material such as silicon nitride or a dielectric metal oxide (such as aluminum oxide). The thickness of the third hard mask layer can be in a range from 20 nm to 200 nm, such as from 20 nm to 50 nm, although lesser and greater thicknesses can also be employed. Alternatively, the third hard mask layer can include two or more materials, for example silicon nitride, silicon oxide, amorphous silicon or amorphous carbon, to apply a double patterning process.

The fifth photoresist layer 317 can be patterned with a line and space pattern. Patterned portions of the fifth photoresist layer 317 laterally extend along the first horizontal direction hd1 with a respective uniform width. Thus, line trenches are present among the patterned portions of the fifth photoresist layer 317. The line trenches laterally extend along the first horizontal direction hd1, and are laterally spaced apart along the second horizontal direction hd2. The line trenches can have a uniform width that is invariant with translation along the first horizontal direction hd1. The pattern in the fifth photoresist layer 317 can be a periodic pattern that is repeated along the second horizontal direction hd2 with a pitch that is equal to the sum of the width of a line trench in the fifth photoresist layer 317 and the width of a patterned line-shaped portion of the fifth photoresist layer 317. The pitch can be in a range from 32 nm to 100 nm, although lesser and greater pitches can also be employed.

Upper second-level isolation trenches 255 are formed through the second sacrificial material layer, the third hard mask layer, the second stacked rail structures (23R, 24R, 26R, 27R), and the in-process second-level dielectric isolation structures (252R, 254R). An anisotropic etch process can be performed to etch portions of the second sacrificial material layer, the third hard mask layer, the second top electrode rails 27R, the second selector rails 24R, the second resistive memory rails 26R, the second bottom electrode rails 23R, and the in-process second-level dielectric isolation structures (252R, 254R) that are not masked by the fifth photoresist layer 317. Volumes from which the materials of the second sacrificial material layer, the third hard mask layer, the second top electrode rails 27R, the second selector rails 24R, the second resistive memory rails 26R, the second bottom electrode rails 23R, and the in-process second-level dielectric isolation structures (252R, 254R) are removed constitute the upper second-level isolation trenches 255. The upper second-level isolation trenches 255 laterally extend along the first horizontal direction hd1.

The chemistry of the anisotropic etch process can be sequentially modified to etch through the various materials of the second sacrificial material layer, the third hard mask layer, the second top electrode rails 27R, the second selector rails 24R, the second resistive memory rails 26R, the second bottom electrode rails 23R, and the in-process second-level dielectric isolation structures (252R, 254R). The anisotropic etch process can stop at the top surface of, or within, the second cobalt cap liners 226 and the first dielectric isolation rails (156R, 158R). The upper second-level isolation trenches 255 can be line trenches laterally extending along the first horizontal direction hd1 and having a respective vertically undulating bottom surface. Each upper second-level isolation trench 255 can vertically extend from the horizontal plane including the bottom surface of the fifth photoresist layer 317 to the top surface of the second cobalt cap liners 226 and the first dielectric isolation rails (156R, 158R).

The third hard mask layer is divided into third hard mask strips 312. The second sacrificial material layer is divided into a one-dimensional array of second sacrificial material rails 31. Each vertical stack of a second top electrode rail 27R, a second resistive memory rails 26R, a second selector rails 24R, and a second bottom electrode rail 23R is divided into a row of second memory pillar structures (23, 24, 26, 27) that are laterally spaced apart long the second horizontal direction hd2. The combination of the second top electrode rails 27R, the second resistive memory rails 26R, the second selector rails 24R, and the second bottom electrode rails 23R is divided into a two-dimensional array of second memory pillar structures (23, 24, 26, 27), which may be a periodic two-dimensional array. The two-dimensional array of second memory pillar structures (23, 24, 26, 27) can form a rectangular periodic two-dimensional array having the first pitch along the first horizontal direction hd1 and the second pitch along the second horizontal direction hd2.

Each second memory pillar structure (23, 24, 26, 27) can include, from bottom to top, a second bottom electrode 23 that is a patterned portion of a second bottom electrode rail 23R, a second selector pillar 24 that is a patterned portion of a second selector rail 24R, a second resistive memory element 26 that is a patterned portion of a resistive memory rail 26R, and a second upper electrode 27 that is a patterned portion of a second top electrode rail 27R. Each second bottom electrode 23 can include a vertical stack of a second bottom electrode metal plate 232 (which is a patterned portion of a second bottom electrode metal rail 232R) and a second bottom electrode metallic nitride portion 234 (which is a patterned portion of a second bottom electrode metallic nitride rail 234R). Each second top electrode 27 includes a vertical stack of a second top electrode metallic nitride portion 272 (which is a patterned portion of a second top electrode metallic nitride rail 272R) and a second top electrode metal portion 274 (which is a patterned portion of a second top electrode metal rail 274R).

Each second resistive memory element 26 can include a phase change memory material, an oxygen-vacancy-containing metal oxide, a filamentary metal oxide or a MRAM stack. Each second selector pillar 24 is a selector element, i.e., an element that provides non-linear voltage-current characteristics such that the element functions as a conductor under second voltage bias conditions and as an insulator under third voltage bias conditions. In one embodiment, of the second resistive memory element 26 is a phase change memory material, then each second selector pillar 24 can include a second ovonic threshold switch material portion 24 that is a patterned portion of a second selector rail 24R.

Each in-process second-level dielectric isolation structure (252R, 254R) is divided into a row of discrete dielectric material structures, which are herein referred to as second dielectric isolation pillars (252, 254). Each second dielectric isolation pillar (252, 254) comprises a second dielectric pillar liner 252 (which is a U-shaped patterned portion of a lower second-level dielectric liner 252R) and a second dielectric pillar fill structure 254 (which is a patterned portion of a lower second-level dielectric fill material rail 254R). The second dielectric isolation pillars (252, 254) can be arranged as a two-dimensional array, which may be a two-dimensional periodic rectangular array. The fifth photoresist layer 317 can be subsequently removed, for example, by ashing. The third hard mask strips 312 can be subsequently removed by an isotropic etch process.

Referring to FIGS. 16A-16C, an upper second-level continuous dielectric liner can be optionally deposited on sidewalls and bottom surfaces of the upper second-level isolation trenches 255 and over the second sacrificial material rails 31. The upper second-level continuous dielectric liner includes a dielectric material such as silicon nitride, a dielectric metal oxide (such as aluminum oxide), or silicon oxide. The upper second-level continuous dielectric liner can be deposited by a conformal deposition method such as chemical vapor deposition (CVD) or atomic layer deposition (ALD). The thickness of the upper second-level continuous dielectric liner can be in a range from 2 nm to 20 nm, such as from 2 nm to 6 nm, although lesser and greater thicknesses can also be employed.

An upper second-level dielectric fill material layer can be deposited on the upper second-level continuous dielectric liner. The upper second-level dielectric fill material layer includes a planarizable dielectric material such as undoped silicate glass (e.g., silicon oxide), doped silicate glass, a spin-on glass (SOG), or a low-k dielectric material. The upper second-level dielectric fill material layer can be deposited by a conformal deposition method or by a self-planarizing deposition method (such as spin coating). In one embodiment, the upper second-level continuous dielectric liner can include, and/or can consist essentially of, a material selected from silicon nitride and a dielectric metal oxide, and the upper second-level dielectric fill material layer can include, and/or can consist essentially of, a material selected from doped silicate glass and undoped silicate glass.

Portions of the upper second-level continuous dielectric liner and the upper second-level dielectric fill material layer can be removed from above the horizontal plane including top surfaces of the second sacrificial material rails 31 by a planarization process. The planarization process can include chemical mechanical planarization (CMP) and/or a recess etch process. Each remaining portion of the upper second-level continuous dielectric liner constitutes an upper second-level dielectric liner 256R, and each remaining portion of the upper second-level dielectric fill material layer constitutes an upper second-level dielectric fill material rail 258R. Each contiguous set of an upper second-level dielectric liner 256R and an upper second-level dielectric fill material rail 258R constitutes a second dielectric isolation rail (256R, 258R), which is a dielectric isolation structure having a shape of a rail. The second dielectric isolation rail (256R, 258R) is formed in each of the upper second-level isolation trenches 255 as a rail structure. The second dielectric isolation rails (256R, 258R) laterally extend along the first horizontal direction hd1, and are laterally spaced among one another along the second horizontal direction hd2. The top surfaces of the second dielectric isolation rails (256R, 258R) can be coplanar with the top surfaces of the second sacrificial material rails 31.

Referring to FIGS. 17A-17C, third line trenches 319 are formed by selective removal of the second sacrificial material rails 31 without removing the second dielectric isolation rails (256R, 258R) or the second top electrodes 27. For example, if the second sacrificial material rails 31 include amorphous silicon, a wet etch process employing hot trimethyl-2 hydroxyethyl ammonium hydroxide ("hot TMY") or tetramethyl ammonium hydroxide (TMAH) can be performed to isotropically etch the second sacrificial material rails 31. If the second sacrificial material rails 31 include amorphous carbon, an ashing process can be performed to remove the second sacrificial material rails. The third line trenches 319 are formed in volumes from which the second sacrificial material rails 31 are removed.

Referring to FIGS. 18A-18C, in-process third conductive rails (222, 224) are formed within each third line trench 319 by deposition and planarization of at least one third metallic material. For example, a third metallic liner material and a third metal fill material can be sequentially formed in the third line trenches 319. The third metallic liner material can include cobalt, ruthenium or molybdenum. The third metallic liner material can be the same as, or different from, the second metallic liner material. In one embodiment, the third metallic liner material can consist essentially of cobalt or can comprise a cobalt alloy such as a cobalt-tungsten phosphorus (CoWP) alloy, a cobalt-tungsten-nitrogen (CoWN) alloy, or a cobtalt-tungsten-boron-phosphorus (CoWBP) alloy. In another embodiment, the first metallic liner material can consist of ruthenium, a ruthenium alloy such as RuTiN, RuSi, RuTa, RuN, or molybdenum or a molybdenum alloy such as MoN, MoSi, MoSiN. The third metallic liner material can be deposited non-selectively by a conformal deposition or a non-conformal deposition. For example, the third metallic liner material can be deposited by physical vapor deposition (PVD), chemical vapor deposition (CVD) or atomic layer deposition (ALD). The thickness of the third metallic liner material can be in a range from 2 nm to 20 nm, such as from 2 nm to 7 nm, although lesser and greater thicknesses can also be employed. The third metal fill material can include copper or a copper-based metallic fill material including copper at an atomic concentration greater than 90%, which may be greater than 95% and/or 99%. The third metal fill material can consist essentially copper of a copper-based metallic fill material (e.g., copper alloy). In one embodiment, the third metal fill material can include copper that is deposited by electroplating. In another embodiment, the first metallic liner and the first metal fill material consist of the same material, for example cobalt, ruthenium, molybdenum, a cobalt alloy, a ruthenium alloy, a molybdenum alloy, copper or a copper based metallic material.

The third metal fill material and the third metallic liner material can be subsequently planarized by a planarization process, which can employ chemical mechanical planarization (CMP) and/or a recess etch. Top surfaces of the remaining portions of the third metal fill material and the third metallic liner material can be formed at, or near, the level of the top surface of the second dielectric isolation rails (256R, 258R).

Each remaining portion of the third metallic liner material constitutes a third metallic liner 322. Each remaining portion of the third metal fill material constitutes a third metal fill material portion 324. Each pair of a third metallic liner 322 and a third metal fill material portion 324 filling a third line trench 319 constitutes an in-process third conductive rail (322, 324). The in-process third conductive rails (322, 324) laterally extend along the first horizontal direction hd1 and are laterally spaced apart along the second horizontal direction hd2 by the second dielectric isolation rails (256R, 258R). In another embodiment, the third cobalt cap liners 326 can be formed only on the third metal fill portions 324. A laterally alternating sequence of in-process third conductive rails (322, 324) and second dielectric isolation rails (256R, 258R) is formed. Each of the in-process third conductive rails (322, 324) and the second dielectric isolation rails (256R, 258R) laterally extend along the first horizontal direction hd1. Each of the in-process third conductive rails (322, 324) comprises a third metallic liner 322 surrounding on three sides, and contacting sidewalls and a bottom surface of, a third metal fill portion 324. In one embodiment, the third metal fill portions 324 comprise copper atoms at an atomic concentration greater than 90%. In one embodiment, the top surfaces of the in-process third conductive rails (322, 324) and the second dielectric isolation rails (256R, 258R) may be formed within a same horizontal plane.

The processing steps of FIGS. 17A-17C and 18A-18C provide replacement of the second sacrificial material rails 31 with conductive material portions which constitute the in-process third conductive rails (322, 324). The in-process third conductive rails (322, 324) are subsequently incorporated into third conductive rails. The in-process third conductive rails (322, 324) extend along the first horizontal direction hd1 and overlie top surfaces of the rectangular array of second memory pillar structures (23, 24, 26, 27).

Subsequently, third cobalt cap liners 326 can be formed by selectively growing cobalt from the physically exposed metallic surfaces of the in-process third conductive rails (322, 324) while suppressing growth of cobalt from the physically exposed surfaces of the second dielectric isolation rails (256R, 258R). Thus, the third cobalt cap liners 326 grow from the top surfaces of the third metallic liners 322 and the third metal fill portions 324. The same cobalt selective deposition process can be employed to form the third cobalt cap liners 326 as the selective cobalt deposition processes that can be employed to form the first and second cobalt cap liners (126, 226).

The thickness of each third cobalt cap liner 326 can be in a range from 2 nm to 20 nm, such as from 2 nm to 7 nm, although lesser and greater thicknesses can also be employed. Each contiguous combination of an in-process third conductive rail (322, 324) and a third cobalt cap liner 326 constitutes a third conductive rail 32. Thus, each third conductive rail 32 includes a third metallic liner 322, a third metal fill portion 324, and a third cobalt cap liner 326. In one embodiment, each third cobalt cap liner 326 can consist essentially of cobalt. Further, each third metallic liner 322 can consist essentially of cobalt, and each third metal fill portion 324 can consist essentially of electroplated copper. Each third cobalt cap liner 326 can comprise convex surfaces that extend along upper edges of the sidewalls of an underlying third metal fill portion 324, a top surface that adjoins each of the convex surfaces, and a bottom surface that adjoins each of the convex surfaces. In one embodiment, the convex surfaces are equidistant from a most proximal upper outer periphery of an underlying third metallic liner 322. A laterally alternating sequence of third conductive rails 32 and second dielectric isolation rails (256R, 258R) is formed. Each of the third conductive rails 32 and the second dielectric isolation rails (256R, 258R) laterally extend along the first horizontal direction hd1. The set of structural elements overlying the laterally alternating sequence of the second conductive rails 22 and the first dielectric isolation rails (156R, 158R) after the processing steps of FIGS. 18A-18C is herein referred to as a second-tier structure.

Additional tier structures can be performed by repeating the processing steps of FIGS. 12A-12C, 13A-13C, 14A-14C, 15A-15C, 16A-16C, 17A-17C, and 18A-18C at least once with a 90 degree rotation in patterns in each successive tier structure. Each odd-numbered tier structure can replicate the pattern employed to form the first-tier structure, and each even-numbered tier structure can replicate the pattern employed to form the second-tier structure. Multiple levels of two-dimensional cross-point memory cell arrays can be formed, which collectively constitute a three-dimensional memory cell array.

Referring to all drawings and according to various embodiments of the present disclosure, a memory device is provided, which comprises: first conductive rails 12 laterally extending along a first horizontal direction hd1 over a substrate 8, wherein each of the first conductive rails 12 comprises a first liner 122, such as a cobalt-containing liner 122, contacting sidewalls and a bottom surface of a first copper-containing fill portion 124, and a first cobalt-containing cap liner 126 contacting a top surface of the first copper-containing fill portion 124; a rectangular array of first memory pillar structures (13, 14, 16, 17) overlying top surfaces of the first conductive rails 12, wherein each first memory pillar structure (13, 14, 16, 17) comprises a respective first resistive memory element 16; and second conductive rails 22 laterally extending along a second horizontal direction hd2 and overlying top surfaces of the rectangular array of first memory pillar structures (13, 14, 16, 17).

In one embodiment, each first cobalt-containing cap liner 126 comprises convex surfaces (e.g., side surfaces) 126S that extend along upper edges of the sidewalls of an underlying first copper-containing fill portion 124, a top surface that adjoins each of the convex surfaces, and a bottom surface that adjoins each of the convex surfaces. In one embodiment, the convex surfaces are equidistant from a most proximal upper outer periphery of an underlying first liner 122. In one embodiment, the convex surfaces are equidistant from a most proximal one of the upper edges of the sidewalls of the underlying first copper-containing fill portion 124.

In one embodiment, an entirety of each top surface of the first copper-containing fill portions 124 contacts a bottom surface of a respective one of the first cobalt-containing cap liners 126. In one embodiment, the first conductive rails 12 are laterally spaced apart along the second horizontal direction hd2 by first dielectric rails 110; and bottom surfaces of the first cobalt-containing cap liners 126 are within a same horizontal plane as the top surfaces of the first copper-containing fill portions 124 and as top surfaces of the first liners 122 and the first dielectric rails 110. In one embodiment, the first copper-containing fill portions 124 comprise copper atoms at an atomic concentration greater than 90%, the first cobalt-containing cap liners 126 consist essentially of cobalt, and the first liners 122 comprise cobalt-containing liners which consist essentially of cobalt or comprise a cobalt alloy selected from a cobalt-tungsten phosphorus (CoWP) alloy, a cobalt-tungsten-nitrogen (CoWN) alloy, or a cobtalt-tungsten-boron-phosphorus (CoWBP) alloy. Alternatively, the first liners 122 can comprise, ruthenium, molybdenum, or alloy of ruthenium or a molybdenum selected from a ruthenium-titanium-nitrogen alloy (RuTiN), ruthenium silicide (RuSi), a ruthenium tantalum (RuTa) alloy, ruthenium nitride (RuN), molybdenum nitride (MoN), molybdenum silicide (MoSi), and a molybdenum-silicon-nitrogen (MoSiN) alloy.

In one embodiment, the memory device can further comprise first dielectric isolation rails (156R, 158R) laterally extending along the second horizontal direction hd2, contacting sidewalls of a respective neighboring pair of the second conductive rails 22, and contacting top surfaces of the first cobalt-containing cap liners 126, and a row of first dielectric isolation pillars (252, 254) contacting sidewalls of a neighboring pair of first memory pillar structures (13, 14, 16, 17) that are laterally spaced apart along the second horizontal direction hd2, contacting a respective neighboring pair of the first dielectric isolation rails (156R, 158R) that are laterally spaced apart along the first horizontal direction hd1, and contacting a bottom surface of a respective one of the second conductive rails 22.

In one embodiment, each first memory pillar structure (13, 14, 16, 17) comprises a series connection of a respective first selector element 14 and a respective first resistive memory element 16. In one embodiment, each first resistive memory element 16 comprises a phase change memory material and each first selector element comprises an ovonic threshold switch material portion. Alternatively, each first resistive memory element 16 can comprise a material selected from a filamentary metal oxide, an oxygen-vacancy-containing metal oxide, and a magnetoresistive material layer stack that constitutes a magnetoresistive memory element.

In one embodiment, each of the second conductive rails 22 comprise a second liners 222, such as cobalt-containing liners, contacting sidewalls and a bottom surface of a second copper-containing metal fill portion 224, and a second cobalt-containing cap liner 226 contacting a top surface of the second copper-containing portion 224. Alternatively, the first liners 222 comprise ruthenium, a ruthenium alloy such as RuTiN, RuSi, RuTa, RuN, or molybdenum or a molybdenum alloy such as MoN, MoSi, MoSiN. In one embodiment, the memory device can further comprise a rectangular array of second memory pillar structures (23, 24, 26, 27) overlying top surfaces of the second conductive rails 22, wherein each second memory pillar structure (23, 24, 26, 27) comprises a respective second resistive memory element 26.

The various embodiments of the present disclosure provide low resistance access lines (such as word lines and bit lines) for a three-dimensional resistive memory device in a cross-point array configuration. The access lines (12, 22, 32) can be formed with copper as a predominant electrically conductive portion with cobalt-containing barriers and cobalt-containing cap liners. Selector elements and resistive memory elements can be provided between a respective pair of a top electrode and a bottom electrode, each of which is electrically connected to a respective low-resistance access line. Cobalt-containing barrier liners and cobalt-containing cap liners can provide superior resistance to electromigration and enhanced reliability compared to prior art metal lines. The fabrication process can reduce the processing time and process cost through selective cobalt deposition processes and self-aligned damascene trench formation employing sacrificial material rails. The embodiment fabrication process does not require any additional lithography step for connecting resistive memory elements or for forming damascene trenches for metal lines. Thus, up to two lithography steps can be eliminated compared to the conventional damascene process with copper lines encapsulated with SiCN capping layer per memory array level. It is estimated that the sheet resistances of access lines may be reduced by 42% to 57% at the 40 nm pitch lithographic node, by 34% to 43% at the 32 nm pitch lithographic node, and by 18% to 22% at the 24 nm pitch lithographic node, respectively, compared to conventional device structures with tungsten metal lines, assuming the same line height and barrier metal thickness at each lithographic node. Further pitch scaling is possible with additional reduction in the resistance of the access lines. Alternatively or additionally, the parasitic capacitance of memory array can be reduced by reducing the thicknesses of the access lines. In addition, the configuration of completely wrapping copper inside cobalt-containing liners can provide about 1000 times longer electromigration failure lifetime compared with copper lines encapsulated with a SiCN capping layer.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising:
   first conductive rails laterally extending along a first horizontal direction over a substrate, wherein each of the first conductive rails comprises a first liner contacting sidewalls and a bottom surface of a first copper-containing fill portion, and a first cobalt-containing cap liner contacting a top surface of the first copper-containing fill portion;
   a rectangular array of first memory pillar structures overlying top surfaces of the first conductive rails, wherein each first memory pillar structure comprises a respective first resistive memory element;
   second conductive rails laterally extending along a second horizontal direction and overlying top surfaces of the rectangular array of first memory pillar structures;
   first dielectric isolation rails laterally extending along the second horizontal direction, contacting sidewalls of a respective neighboring pair of the second conductive rails, and contacting top surfaces of the first cobalt-containing cap liners; and
   a row of first dielectric isolation pillars contacting sidewalls of a neighboring pair of first memory pillar structures that are laterally spaced apart along the second horizontal direction, contacting a respective neighboring pair of the first dielectric isolation rails that are laterally spaced apart along the first horizontal direction, and contacting a bottom surface of a respective one of the second conductive rails.

* * * * *